United States Patent
Berens et al.

(10) Patent No.: US 7,191,377 B2
(45) Date of Patent: *Mar. 13, 2007

(54) COMBINED TURBO-CODE/CONVOLUTIONAL CODE DECODER, IN PARTICULAR FOR MOBILE RADIO SYSTEMS

(75) Inventors: Friedbert Berens, Geneva (CH); Gerd Kreiselmaier, Hochdorf-Assenheim (DE)

(73) Assignees: STMicroelectronics N.V., Amsterdam (NL); STMicroelectronics S.r.l., Agrate Brianza (IT)

( * ) Notice: Subject to any disclaimer, the term of this patent is extended or adjusted under 35 U.S.C. 154(b) by 442 days.

This patent is subject to a terminal disclaimer.

(21) Appl. No.: 10/653,721

(22) Filed: Sep. 2, 2003

(65) Prior Publication Data
US 2005/0278603 A1 Dec. 15, 2005

(30) Foreign Application Priority Data
Sep. 5, 2002 (EP) ................... 02019974

(51) Int. Cl.
*H03M 13/00* (2006.01)
(52) U.S. Cl. ...................................... 714/755
(58) Field of Classification Search ................. 714/786
See application file for complete search history.

(56) References Cited

U.S. PATENT DOCUMENTS

| | | | | |
|---|---|---|---|---|
| 6,226,773 B1 * | 5/2001 | Sadjadpour | ................. | 714/794 |
| 6,484,283 B2 * | 11/2002 | Stephen et al. | ............. | 714/786 |
| 6,829,313 B1 * | 12/2004 | Xu | ............... | 375/341 |
| 2001/0044919 A1 | 11/2001 | Edmonston et al. | ......... | 714/752 |
| 2002/0061069 A1 | 5/2002 | Tran et al. | ................... | 375/265 |
| 2002/0119803 A1 | 8/2002 | Bitterlich et al. | ........... | 455/552 |
| 2003/0018942 A1 * | 1/2003 | Seo | ............... | 714/786 |
| 2003/0097633 A1 * | 5/2003 | Nguyen | ...................... | 714/786 |
| 2003/0208716 A1 * | 11/2003 | Wolf | ......................... | 714/796 |

FOREIGN PATENT DOCUMENTS

JP 2001285079 10/2001

OTHER PUBLICATIONS

Page 473 from Blahut, Richard. Theory and pratice of error control codes. Published 1983 by Addison-Wesley Publishing company.*

* cited by examiner

*Primary Examiner*—Albert Decady
*Assistant Examiner*—Sam Rizk
(74) *Attorney, Agent, or Firm*—Lisa K. Jorgenson; Allen, Dyer, Doppelt, Milbrath & Gilchrist, P.A.

(57) ABSTRACT

A combined decoder reuses input/output RAM of a turbo-code decoding circuit as alpha-RAM or beta-RAM for a convolutional code decoding circuit. Additional operational units are used for both turbo-coding and convolutional coding. An effective harware folding scheme permits calculation of 256 states serially on 8 ACS units.

33 Claims, 12 Drawing Sheets

COMBINED TURBO-CODE/CONVOLUTIONAL CODE DECODER, IN PARTICULAR FOR MOBILE RADIO SYSTEMS

FIELD OF THE INVENTION

The invention relates in general to channel coding and decoding techniques, and in particular, to turbo-codes and convolutional codes. An application of the invention is directed in general to the field of wireless communication systems, and more particularly, to the CDMA systems such as the different CDMA based mobile radio systems like CDMA 2000, WCDMA (Wide Band CDMA) or the IS-95 standard.

BACKGROUND OF THE INVENTION

The third generation mobile radio system specifies convolutional codes and turbo-codes as channel coding techniques [3GPP, Technical Specification Group Radio Access Network; Multiplexing and channel coding (FDD); (3G TS 25.212 version 3.5.0(2000-12)), Release 1999].

In turbo-code encoders forward error correction is enabled by introducing parity bits. For turbo-codes, the original information, denoted as systematic information, is transmitted together with the parity information. The encoder for 3GPP includes two recursive systematic convolutional (RSC) encoders with constraint length K=4, which can also be interpreted as 8-state finite state machines. The first RSC encoder works on the block of information in its original sequence, and the second one works on the block of information in an interleaved sequence.

On the receiver side, there is a corresponding component decoder for each of them. Each component decoder implements a maximum-a-posteriori (MAP) algorithm, and is usually called a soft-in-soft-out (SISO) decoder.

Each block is decoded in an iterative manner. The systematic information and the parity information serve as inputs of the first component decoder (MAP1). The soft-output of MAP1 reflects its confidence on the received bits of being sent either as '0' or '1'. These confidences are interleaved in the same manner as in the encoder, and are passed to the second component decoder (MAP2) as a-priori information. The second component decoder uses this information to bias its estimation comprising the interleaved systematic information and the parity information of the second encoder. The soft-outputs are again passed on to MAP1, and so on. The exchange continues until a stop criteria is fulfilled. Stop criteria range from simple cases, such as a "fixed number of iterations", over cyclic redundancy check (CRC) to rather complex statistical analysis.

Implementation issues for turbo-decoder architectures using the MAP algorithm have already been discussed in several papers and are well known [A. Worm, Implementation Issues of Turbo-Decoders. Phd thesis, Institute of Microelectronic Systems, Department of Electrical Engineering and Information Technology, University of Kaiserslautern, Forschungsberichte Mikroelektronik, Bd.3, Germany, 2001].

The MAP algorithm is transformed into the logarithmic domain to reduce operator strength [S. S. Pietrobond and A. S. Barbulescu, A Simplification of the Modified Bahl Decoding Algorithm for Systematic Convolutional Codes, In Proc. International Symposium on Information Theory and its Applications, pages 1073–1077, Sydney, Australia, November 1994]. Multiplications become additions and additions are replaced by a modified comparison. It includes a forward recursion, a backward recursion and soft-output calculation. To calculate a recursion step for a state, a modified accumulate-compare-select (ACS*) unit is necessary.

During turbo decoding only one MAP is active at a time. Due to the moderate throughput requirements both MAP calculations of the iterative loop can be mapped on a single hardware unit, thus only one MAP unit is necessary. In addition to the MAP unit, memories are needed to store the input and output values. Further storage is required for intermediate values like the a-priori information and the alpha-state-metrics. The interleaver and deinterleaver pattern generators also revert to memories. It becomes obvious, that for large block sizes memory dominates a turbo decoder architecture.

The size of the input RAMs for the systematic and parity information and the output RAM is determined by the block sizes which are defined in the 3GPP standard. The output RAM serves also as storage for the a-priori values. One soft-output memory is sufficient because the calculated soft-outputs are always written to the previous read position of the a-priori information. Thus no RAM is needed for the interleaved soft-outputs.

The size of the alpha-memory (which stores the alpha-states-metrics) can be reduced by introducing a windowing technique, where a window slides in the direction of increasing bit positions [H. Dawid and H. Meyr, Real-Time Algorithms and VLSI Architectures for Soft Output MAP Convolutional Decoding, In Proc. 1995 International Symposium on Personal, Indoor, and Mobile Radio Communications (PIMRC'95), pages 193–197, Toronto, Canada, September 1995] for delivering almost the same communication performance as the original MAP decoder. The size of a window is significantly smaller than the block size. It ranges typically between 32 and 128. Windowing implicates additional computations during the acquisition. The saving in the alpha-memory, however, requires these extra computations.

In convolutional encoders forward error correction is also enabled by introducing parity bits. In 3GPP two different encoders with a constraint length K=9 are specified. Convolutional decoding, in contrast to turbo decoding, is non-iterative. The MAP algorithm is activated only once for each block. Although the interleaver is not needed and the block size is much smaller than for turbo-codes, the architecture of a 3GPP convolutional decoder is also dominated by memory. The I/O memories are rather small compared to the turbo decoder. The alpha-memory, however, exceeds that of the turbo decoder by a factor of 32 assuming the same window size. This is formed in the large number of states (256) of the convolutional decoder.

The main problem of the above mentioned turbo-code and convolutional code decoders is the need for large memories. Therefore, an implementation of individual decoders is costly.

SUMMARY OF THE INVENTION

In view of the foregoing background, an object of the present invention is to provide a combined turbo-code/convolutional code decoder.

The combined decoder comprises turbo-code decoding means for performing turbo-code decoding, and convolutional code processing means for performing convolutional code. The turbo-code and convolutional code decoding means comprise common processing means of the soft-in-soft-out type decoding means for implementing a maximuma-posteriori (MAP) algorithm, for example. The common processing means may also have a first configuration dedicated to turbo-code decoding, and a second configuration dedicated to convolutional code decoding.

Metrics memory means may store state metrics, such as forward state metrics, for example, associated to the states of a first trellis and delivered by the processing means in its first configuration. Input/output memory means may store input and output data delivered to and by the processing means in its second configuration.

Adaptable memory means may store input and output data delivered to and by the processing means in its first configuration, and may store state metrics, such as forward state metrics for example, associated to the states of a second trellis and delivered by the processing means in its second configuration.

Control means may configure the common processing means in its first or second configuration depending on the type of code. Memory control means may be used for addressing differently the adaptable memory means depending on the configuration of the common processing means.

In other words, according to the invention, there is a re-use of input/output RAM of the turbo-code decoding means as alpha-RAM (storage of forward state metrics) or beta-RAM (storage of backward state metrics) for convolutional code decoding means.

According to an embodiment of the invention, the adaptable memory means may comprises main memory means for storing input and output data delivered to and by the processing means in its first configuration, and for storing a first part of the state metrics delivered by the processing means in its second configuration. An additional memory means may store the last part of the state metrics delivered by the processing means in its second configuration.

More particularly, for example, the turbo-code decoding means may be adapted to receive successive sequences of N1 symbols of b1 bits. The input and output data delivered to and by the processing means in its first configuration may comprise for each received sequence, g different blocks of N1 words of b1 bits, (for example, g=4, N1=5120 and b1=6).

The state metrics to be stored in the adaptable memory means may be a block of N2 words of b2 bits, with b2 being greater than b1, (for example b2=88 and N2=1728). The main memory means may comprise g groups of p elementary memories (p=3 for example) respectively dedicated to the g blocks of N1 words, with each elementary memory being adapted to store N2 words of b1 bits. The product may be equal to the greatest integer smaller than the ratio b2/b1, and the product pN2 may be equal or greater than N1. The additional memory may be adapted to store N2 words of b2-gpb1 bits (for example 16 bits).

The memory control means may address the adaptable memory means in the first configuration such that each block of N1 words of b1 bits is written in or read from its dedicated group of p elementary memories. Each state metric may be formed with gp elementary words of b1 bits plus an additional elementary word of b2-gpb1 bits. The memory control means may address the adaptable memory means in the second configuration such that the gp elementary words of the state metric are respectively stored in the gp elementary memories of the main memory means at the same address, whereas the additional elementary word of the state metric is stored in the additional memory means at the same address.

According to another embodiment of the invention, the additional memory means may not be necessary. This is the case for example when b2 is a multiple of b1, and the product gp is equal to the ratio b2/b1. In such an embodiment, the memory control means may address the adaptable memory means in the first configuration such that each block of N1 words of b1 bits is written in or read from its dedicated group of p elementary memories.

Each state metric may be formed with gp elementary words of b1 bits. The memory control means may address the adaptable memory means in the second configuration such that the gp elementary words of the state metric are respectively stored in the gp elementary memories at the same address.

Further to the re-use of the input/output RAM of the turbo-code decoder as alpha-RAM or beta-RAM for the convolutional code decoder, the invention may advantageously comprise re-use of operational units for both turbo-code and convolutional code.

More particularly, according to an embodiment of the invention, with ST1 being the number of states of the first trellis (ST1=8 for example), ST2 being the number of states of the second trellis (ST2=256 for example), and r being the integer ratio ST2/ST1, the common processing means may comprise a configurable state metrics unit to recursively calculate in parallel ST1 state metrics, for example forward state metrics, in the first configuration. The common processing means may, in the second configuration, recursively calculate serially r groups of in parallel calculated ST1 state metrics, for example forward state metrics.

According to an embodiment of the invention, the common processing means may comprise a branch metric unit for calculating in each first and second configurations the branch metrics associated to the branches of the corresponding trellis.

The configurable state metrics unit may comprise ST1 parallel ACS (Add, Compare, Select) units for calculating in each configuration ST1 state metrics, auxiliary memory means for temporally storing the calculated state metrics for a recursive calculation, and auxiliary control means for controlling the storage of the metrics in the auxiliary memory means depending on the configuration of the common processing means.

The auxiliary memory means may comprise a register for temporally storing ST1 state metrics during the turbo-code decoding, and two pairs of supplementary memories connected to said register for temporally storing ST2 state metrics during the convolutional code decoding.

The auxiliary control means may comprise first multiplexing means connected between the output of the register and the two pairs of supplementary memories for allowing a storage swapping of the metrics in the supplementary memories, and second multiplexing means connected directly to the output of the register and to the outputs of the supplementary memories.

According to an embodiment of the invention, the state metrics unit may recursively calculate backward state metrics in a similar way as for calculating the forward state metrics.

According to an embodiment of the invention, the common processing unit may comprise a log-likelihood-ratio (LLR) unit connected to the state metrics unit and to the metrics memory means in the first configuration (turbo-code decoding) and to the adaptable memory means in the second configuration (convolutional code decoding). This is for calculating in each configuration soft output information containing the values of the decoded data respectively associated with a confidence value.

More particularly, the LLR unit has a pipelined architecture, and comprises a part which is used for both turbo-code decoding and convolutional code decoding. The MAP algorithm implemented may be a LogMAP algorithm or a MaxLogMAP algorithm.

The turbo-code decoding means may also advantageously comprise global control means for allowing the turbo-code decoding to be performed in an iterative matter in the common processing means so that only one MAP unit can be used. The combined decoder according to the invention may advantageously be formed as an integrated circuit.

The invention is also directed to a terminal of a wireless communication system, including a combined decoder as defined above. Such a terminal may form a cellular mobile phone or a base station.

BRIEF DESCRIPTION OF THE DRAWINGS

Other advantages and features of the invention will appear on examining the detailed description of embodiments, these being in no way limiting and of the appended drawings in which.

DETAILED DESCRIPTION OF THE PREFERRED EMBODIMENTS

1. Encoding 1.1 General Considerations and Convolutional Encoding

Convolutional encoding is performed by calculating the modulo-2 sum of the input values of the current and/or selected previous time steps. Implementation therefore is straightforward and mainly includes a shift register and a couple of exclusive-OR gates. Through the way these are switched, different kinds of convolutional codes can be realized:

Systematic Codes: One of the output streams is equal to the input stream, which is the systematic information.

Non-Systematic Codes (NSC): Each output is a parity information. Parity information is produced by taking the modulo-2 sum of shift register entries stating the history of the encoding process.

Recursive Codes: A special parity signal is produced and fed back in conjunction with the systematic input.

Non-Recursive Codes: No such feedback loop exists.

An instance of a convolutional encoder is defined by a combination of these properties, the memory depth (constraint length) and the logical functions used to produce the parity information. These properties are described through generator polynomials.

Figure 1:
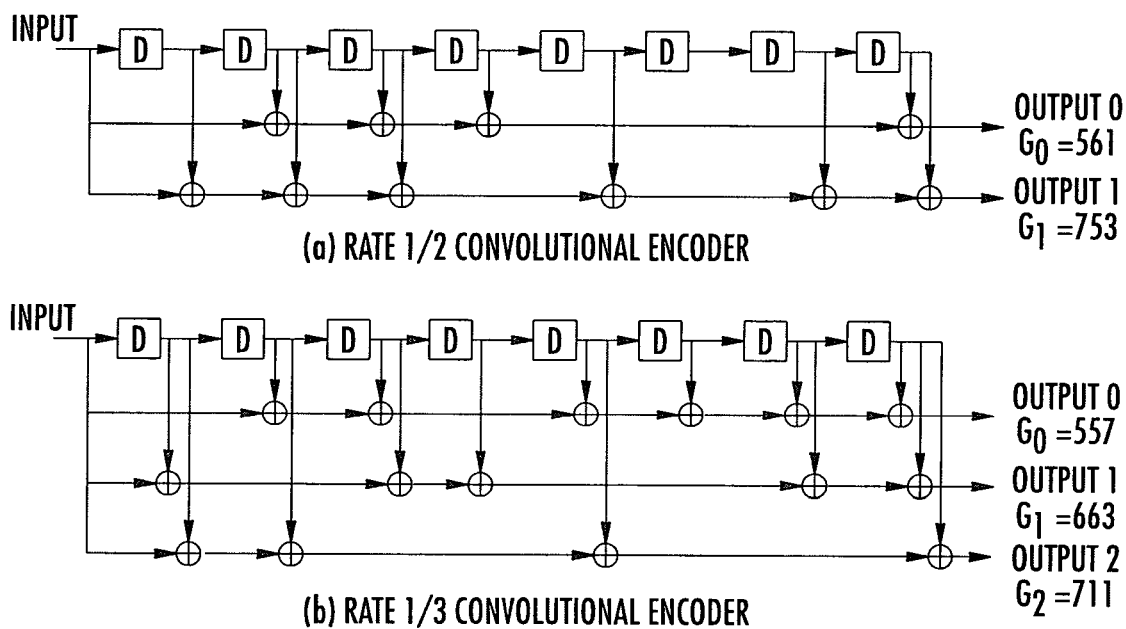
FIG. 1 shows the structure of the two different NSCs used in an UMTS for convolutional encoding according to the prior art.

In FIG. 1, which represents the structure of two different NSCs used in an UMTS for convolution and convolutional encoding, the constraint length is larger (K=9) than for turbo encoding. Furthermore, two different rates have to be considered. The rate ½ convolutional encoder (a) has two outputs, whereas the rate ⅓ encoder (b) has three outputs.

With the value of the current time-step available, M=K−1 flip-flops are needed to store the encoder history. This gives rise to an interpretation of the encoder as a finite-state machine (FSM). It shows a behavior equivalent to a Mealy-automaton. The likelihood of a transition between two states is the key to the decoding of convolutional codes.

1.2 Code-Trellis

A code trellis is the unrolled state chart of a finite-state machine. The number of states the encoder can be in (N) is a function of the constraint length K:

$$N=2^{K-1}.$$

Figure 2:
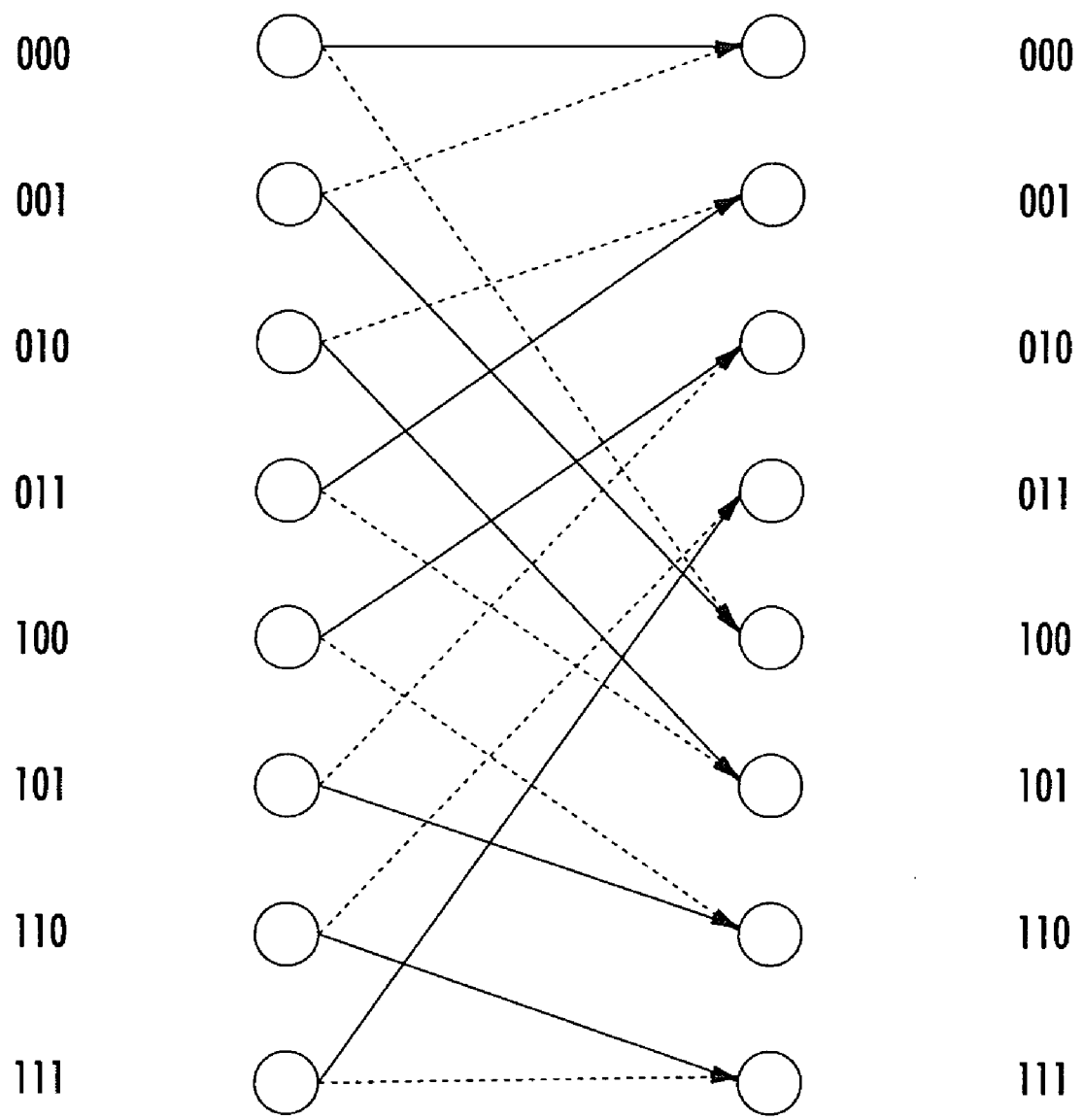
FIG. 2 shows part of a trellis representing possible transitions in a one time step according to the prior art.

Depending on the nature of the code (RSC, NSC, . . . ) only certain transitions are possible. A trellis is used to depict those transitions. In FIG. 2, part of a trellis is shown that represents the possible transitions in one time-step. Instead of the usual tree-structure used to display state-charts, the trellis combines states which are equivalent. Solid lines in FIG. 2 stand for transitions due to the input of a systematic bit of "0" whereas dashed lines represent those caused by a "1". Every encoding process starts in the all-zero state.

1.3 Trellis-Termination

For the considered codes the initial state of the trellis is always known to be the all-zero state. Without taking any precautions, the encoder ends in an arbitrary state, leaving no hint where to start the backward recursion. This can be counteracted by driving the encoder into a defined final state. Reaching the final state (e.g., the all-zero state) can be achieved by appending a sequence, which steers the encoder towards the final state as fast as possible. This sequence is also depending on the state the encoder is in after the last information bit has been coded. The length of this sequence is equal to K−1. The transmitted bits are called tail bits.

1.4 Interleaving

Trellis based decoding is very vulnerable to burst errors. If a sequence of transmitted bits is corrupted, the decoding becomes inaccurate. Therefore a scheme to break up the neighborhood-relations is applied, which is the interleaving.

The key idea behind interleaving is to transmit the bits in a different order than they are produced or consumed. For instance, while bit 4 is encoded consecutively with its neighbors 3 and 5, it might be next to 312 and 1021 during transmission. A burst error in the channel effects bits 312, 4, and 1021. On the receiver side, these errors are spread again through the deinterleaver, which restores the initial order. Thus the decoding is less affected.

1.5 Turbo-Encoding

A turbo code encoder includes two constituent convolutional encoders and an interleaver. The convolutional codes are fixed to be the RSC codes having the rate ½ and the generator polynomials (13,15/(octal notation) introduced before.

Figure 3:
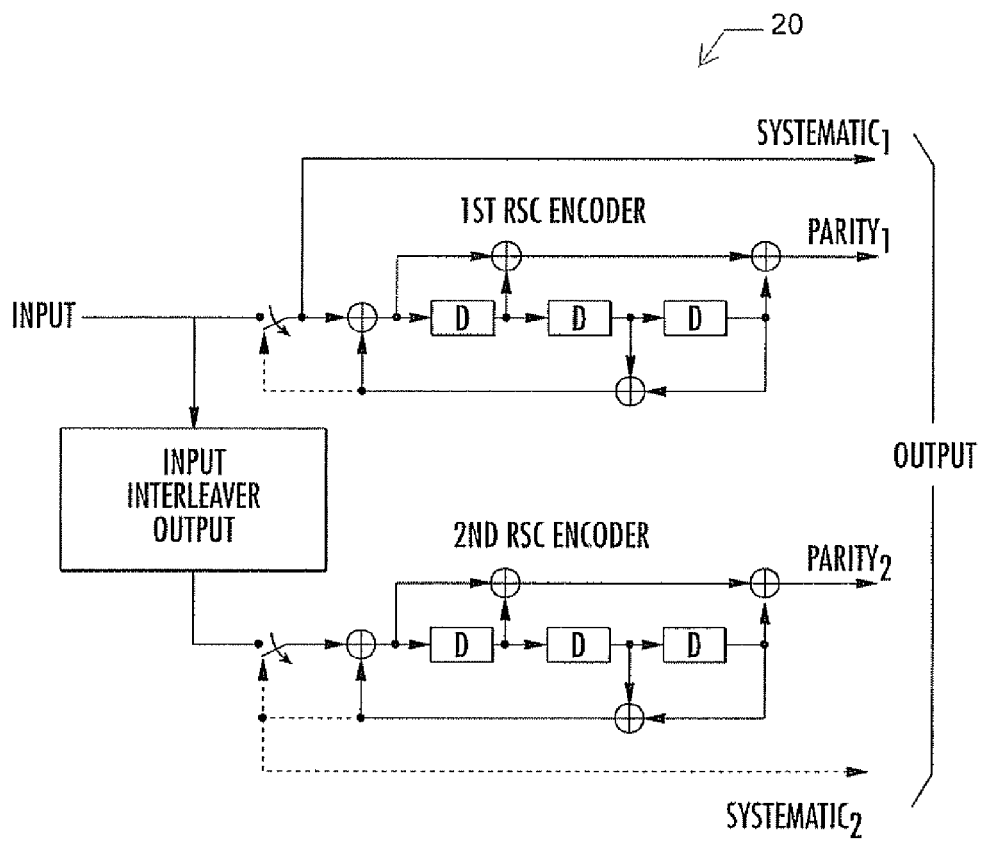
FIG. 3 shows an UMTS turbo-code encoder according to the prior art.

The systematic information of the second encoder is not transmitted because it can be reconstructed (by deinterleaving) from the systematic output of the first encoder. A rate of R=⅓ is achieved. FIG. 3 shows the detailed UNTS turbo code encoder 20. The trellis termination leads each encoder ($1^{st}$ RSC encoder, $2^{nd}$ RSC encoder) into its final state separately. This dissolves the dependency between the systematic information of the first and second encoder for the tail bits because these lead each encoder independent from the other by activating the respective switch, as shown in FIG. 3. Hence the last six bits per encoder (systematic and parity for each) have to be transmitted separately. This results in a total overhead of 12 bits per block.

2. Decoding

Decoding convolutional codes is keeping track of the transitions that took place in the encoder. From those the input symbols which have been sent are deducted. Due to the degradations caused by the channel, only estimates of the systematic and parity bits are available, which will both be called channel values. There are two different kinds of outputs:

Hard values: they merely indicate if a symbol is supposed to be "1" or "0".

Soft values: These also deliver a measure for the reliability of the decision. The hard decision is extended by the probability that the decision is correct.

For turbo decoding only soft-in values are relevant. Based on the channel values, probabilities can be computed that certain combinations of systematic and parity bits occurred. From this and considering the encoder history, the probability that the encoder was in a given state at a given time-step can be computed.

Two approaches exist to deal with those state-probabilities. The maximum likelihood based Viterbi algorithm uses them to search the most likely code-word. For this it traverses the trellis from the all-zero state to the end state and looks for the most likely sequence. The states chosen for the survivor path indicate the most likely sequence of symbols that has been sent. Hence a Viterbi decoder is a sequence estimator.

The maximum-a-posteriori (MAP) algorithm on the other side estimates the probability that the encoder was in the given state and that the current state leads to the final state given the remainder of the channel values. This can be efficiently computed by a forward and backward recursion over the trellis. Afterwards, for each bit the probabilities for those states associated with a systematic "0" are added and compared to those associated with a "1". The symbol with the higher probability is assumed to be the sent one. Since this works on bit rather than on a sequence level, it is called symbol estimation.

Turbo decoding demands soft-output of the convolutional decoders as well. Suitable algorithms are the MAP algorithm and the SOVA (soft output Viterbi algorithm).

The SOVA is usually implemented as a two-step algorithm, with a Viterbi algorithm part and a part responsible for calculating the soft-outputs. The state metric unit of the part realizing the Viterbi can be implemented based on a traceback or a register-exchange structure. The soft-output calculation part mainly includes a competing path computation unit. Except for low throughputs, this unit is implemented as a register-exchange architecture. A major drawback of register exchange units is that they do not lend themselves well to hardware folding. It is therefore difficult (if not impossible) to obtain efficient SOVA architectures for a wide range of throughput requirements. Furthermore, the communication performance of the SOVA with optimal soft update can be only as good as the sub-optimum MaxLogMAP algorithm. For an efficient implementation the MAP algorithm is implemented, which is consistent with a hardware folding according to the invention.

2.1 Turbo Decoding

Decoding turbo codes by searching the most likely codeword is far too complex. Therefore iterative decoding is advised. The two convolutional codes are decoded separately. While doing this, each decoder incorporates information that has been gathered by the other. This "gathering of information" is the exchange of soft-output values, where the bit-estimates of one unit are transformed into a priori information for the next. The decoders have to be soft-input soft-output (SISO) units.

The confidence in the bit estimation is represented as a log-likelihood-ratio (LLR):

$$\Lambda(d_k) = \ln \frac{P(d_k = 1)}{P(d_k = 0)} \quad (2.1)$$

The sign shows whether this bit is supposed to be one or zero, whereas the confidence in the decision is represented by the magnitude.

To extract the information that has been gathered during the last decoding stage, the systematic and a priori information that lead to this estimate have to be subtracted. This yields:

$$L^1(d_k) = \Lambda^1(d_k) - y_k^s - L_{deint}^2(d_k) \quad (2.2)$$

$$L^2(d_k) = \Lambda^2(d_k) - y_{k\,int}^s - L_{int}^1(d_k) \quad (2.3)$$

This is called the extrinsic information.

The confidence of one decoder in a bit to have a certain value biases the initial guess of the other.

Figure 4:
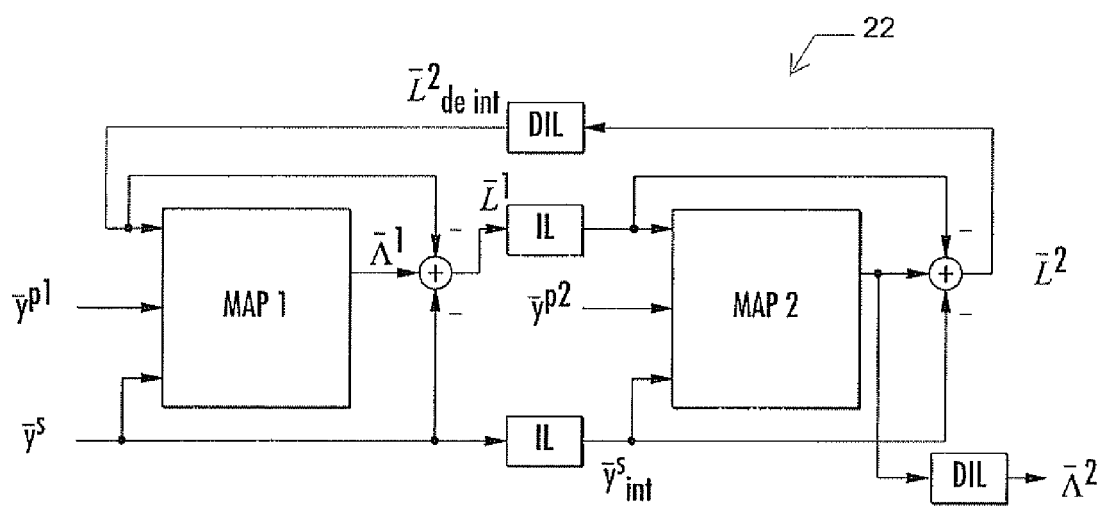
FIG. 4 shows a generic turbo decoder according to the prior art.

FIG. 4 shows such a turbo code decoder 22 including two MAP decoders MAP1 and MAP2, an interleaver IL and a deinterleaver DIL. Feeding the input of one decoder as a priori information input to the next enables the improvement over the decoding iterations, It also gave turbo codes their name, since it resembles the "feedback-of-exhaust" used in combustion turbo engines. Inputs to the decoder are the received channel values (systematic, parity1 and parity2) During the very first MAP1 operation, the a priori information is set to zero.

2.2 The Maximum-A-Posteriori (MAP) Algorithm

The name Maximum-A-Posteriori stems from the fact that the estimation of the bits is based on the whole receiver sequence. It is done after all the information is in.

Equation 2.4 shows the output of such a MAP decoder.

Bahl et al. described in [L. Bahl, J. Cocke, F. Jelinek, and J. Raviv. Optimal Decoding of Linear Codes for Minimizing Symbol Error Rate, IEEE Transaction on Information Theory, IT-20:284–287, March 1974] an efficient algorithm for the MAP decoder, which is based on recursions operating on the trellis in forward and backward recursion. That algorithm is commonly referred to as a MAP algorithm or a BCJR algorithm:

Let $R_k=(y_k^s, y_k^{p1}, L_k^2)$ denote the input of the MAP, with $\vec{R}=(R_1, \ldots, R_k, \ldots R_N)$, where N is the length of the block. Then the BCJR algorithm computes the a-posteriori probabilities (APP)

$$\Lambda(d_k) = \ln \frac{Pr\{d_k = 1 \mid \vec{R}\}}{Pr\{d_k = 0 \mid \vec{R}\}} \quad (2.4)$$

for each data symbol $d_k$ after reception of the symbol sequence $\vec{R}$.

It is computed using two probabilities. One, the encoder has reached state $S_k^m$, with $m \in \{1 \ldots 2^M\}$ after k received symbols:

$$\alpha_k(m) = Pr\{(S_k^m \mid R_0 \ldots R_{k-1}\} \quad (2.5)$$

Another probability is that the remainder of the input sequence will lead the encoder to the final state given the state $S_{k+1}^{m'}$ at time k+1:

$$\beta_{k+1}(m') = Pr\{(R_k \ldots R_N \mid S_{k+1}^{m'}\} \quad (2.6)$$

For this, the probability of a transition from state $S_k^m$ to $S_{k+1}^{m'}$ has to be known. It depends on the code structure, the channel model, the extrinsic information of previous decoding steps and the received symbols $R_k$:

$$\gamma(S_k^m, S_{k+1}^{m'}) = Pr\{(S_k^m, S_{k+1}^{m'} \mid R_k\} \quad (2.7)$$

Using $\gamma, \alpha$ and $\beta$ can be computed recursively by:

$$\alpha_k(m') = \sum_m a_{k-1}(m) \cdot \gamma(S_{k-1}^m, S_k^{m'}) \quad (2.8)$$

$$\beta_k(m) = \sum_{m'} \beta_{k+1}(m') \cdot \gamma(S_{k-1}^m, S_k^{m'}) \quad (2.9)$$

A known start and final state are necessary for the BCJR algorithm to perform optimally. If the trellis is not terminated, all states have to be assumed to have equal probability for k=N.

The a-posteriori probability itself can be expressed as $$\Lambda(d_k) = \ln \frac{\sum_m \sum_{m'} \gamma(S_{k-1}^m, S_k^{m'}, d_k = 1) \cdot \alpha_{k-1}(m) \cdot \beta_k(m')}{\sum_m \sum_{m'} \gamma(S_{k-1}^m, S_k^{m'}, d_k = 0) \cdot \alpha_{k-1}(m) \cdot \beta_k(m')} \quad (2.10)$$

The large number of multiplications involved in the computation of the APP makes it less attractive for implementation. Therefore the MAP algorithm has to be transformed to the logarithmic domain, where it becomes the LogMAP algorithm, which increases numerical stability and eases implementation while not degrading the error correction performance.

2.3 The MAP Algorithm in the Logarithm Domain: Log-MAP

The transformation of multiplications into additions is the motivation for defining the MAP algorithm in the log-domain. A problem is posed by the additions. Using the Jacobian logarithm, the additions are substituted by a new operator:

$$\ln(e^{\delta 1} + e^{\delta 2}) = \max^*(\delta 1, \delta 2) = \max(\delta 1, \delta 2) + \ln(1 + e^{-|\delta 1 - \delta 2|})$$

Similar the negative logarithm can be taken, this leads to $$\min^*(\delta 1, \delta 2) = \min(\delta 1, \delta 2) - \ln(1 + e^{-|\delta 1 - \delta 2|}).$$

For more than two operands, the max* is applied recursively. Since the operator is associative, a tree-like evaluation can be employed, which is advantageous for hardware implementation. The sub-optimal MaxLogMAP algorithm is obtained by using the approximation $$\max^*(\delta 1, \delta 2) \approx \max(\delta 1, \delta 2).$$

Using the max* operation, the recursions become:

$$\ln(\alpha_k(m')) = \max_m^*(\ln(\alpha_{k-1}(m)) + \ln(\gamma(S_{k-1}^m, S_k^{m'}))), \quad (2.11)$$

$$\ln(\beta_k(m)) = \max_m^*(\ln(\beta_{k+1}(m')) + \ln(\gamma(S_k^m, S_{k+1}^{m'}))) \quad (2.12)$$

Let $\ln(\alpha_k(m'))$ from now on be denoted as $\overline{\alpha}_k(m')$ (accordingly for $\beta$ and $\gamma$), then the recursions take the form:

$$\overline{\alpha}_k(m') = \max_m^*(\overline{\alpha}_{k-1}(m) + \overline{\gamma}(S_{k-1}^m, S_k^{m'})), \quad (2.13)$$

$$\overline{\beta}_k(m) = \max_m^*(\overline{\beta}_{k+1}(m') + \overline{\gamma}(S_k^m, S_{k+1}^{m'})). \quad (2.14)$$

Similar we get:

$$\Lambda(d_k) = \max_{m,m'}^* \left( \overline{\gamma}(S_{k-1}^m, S_k^{m'}, d_k = 1) + \overline{\alpha}_{k-1}(m) + \overline{\beta}_k(m') \right) - \max_{m,m'}^* \left( \overline{\gamma}(S_{k-1}^m, S_k^{m'}, d_k = 0) + \overline{\alpha}_{k-1}(m) + \overline{\beta}_k(m') \right) \quad (2.15)$$

Computation $\overline{\gamma}$ includes the estimation of channel values and the a priori information. The conventional method is quite complicated, and an optimized branch metric calculation is used. Prior to transmission, every bit is subject to a transformation. Let $x_k \in \{0,1\}$ denote the (coded) bit, then the transmitted value is $y_k = -2 \cdot x_k + 1$, hence $y_k \in \{-1, 1\}$.

Thus the actual mapping is '1'→'−1' and '0'→'1'.

There are only four different values per k in total the $\overline{\gamma}$ can take, one for every assumption $(x_k^s \in \{-1,1\}, x_k^p \in \{-1,1\})$. The code-structure alone determines which of them is assigned to which transition. After skipping constant factors and making additional algebraic transformations we get:

$$\overline{\gamma}(x_k^s = +1, x_k^p = +1) = 0 \quad (2.16)$$

$$\overline{\gamma}(x_k^s = +1, x_k^p = -1) = \frac{4E_s y_k^p}{N_0}$$

$$\overline{\gamma}(x_k^s = -1, x_k^p = +1) = \frac{4E_s y_k^p}{N_0} + L(d_k)$$

$$\overline{\gamma}(x_k^s = -1, x_k^p = -1) = \frac{4E_s y_k^p}{N_0} + \frac{4E_s y_k^p}{N_0} + L(d_k)$$

This simplifies the implementation significantly, as only two terms have to be computed from the channel and a priori data. One term can be dropped completely and the last one be computed from the first two. The scaling factor $$\frac{4E_s}{N_0}$$

is multiplied externally by usage of a working point.

3. Windowing

The MAP algorithm minimizes the probability of bit-errors, basing the decision for each bit on the knowledge of the complete block of samples that is a posteriori. It has been shown, however, that a sliding window technique, where a window slides in direction of increasing bit positions k, delivers almost the same communication performance as the original MAP decoder. Then the decisions are based on a subblock beginning at the first bit position in the complete block and ending at the last position in the sliding window. The MAP algorithm can decide all bits belonging to the window, less the bits contained in the last portion of that window. The bits in the last portion are decided when the window has moved to its next position(s). If only the bits in the middle part get decoded, then the window does not even have to slide (move steadily in one direction).

When we look at the equations of the MAP algorithm, one can easily identify four subtasks: calculation of the branch metrics (step 1); calculation of the forward state metrics during forward recursion (step 2); calculation of the backward state metrics during backward recursion (step 3); and calculation of the soft outputs (step 4).

The data dependencies between these steps are as follows: both recursions (step 2 and step 3) and the soft output calculation (step 4) depend on the branch metrics (step 1), and the soft output calculation step (step 4) in addition depends on the forward and backward state metrics (step 2 and step 3). All branch metrics and soft outputs of the current data block can be computed independently from each other. Only the order of computing the forward state metrics and the order of computing the backward state metrics are predefined by the direction of the respective recursion.

The sequence of the recursions does not matter, since there is no data dependency between the forward and backward state metrics. The backward recursion can be processed before, in parallel to, or after (as implied above) the forward recursion. Hence, we can introduce the notion of a first and a second recursion. The metrics for the first recursion for a certain trellis step have to be stored in memory until the second recursion has produced the missing complementary metrics for computing the soft output value connected with that trellis step. Thus the decoder needs to store the first recursion metrics of the full data block. Introducing windowing, each comprising a data subblock, breaks this dependency. Decoding on a window-by-window basis permits the required memory size to be reduced.

A prerequisite for decoding on windows is the concept of "acquisition". Originally, the forward and the backward recursion of a MAP decoder start at one end of the trellis and stop at the opposite end. Upon an appropriately long acquisition phase, however, a recursion can start at any trellis step. This applies to both forward and backward recursions.

Consider a forward acquisition commencing at trellis step k-M, where M is the acquisition depth. The forward state metrics are initialized as:

$$\overline{\alpha}_{k-M}(S_{k-M})=0, S_{k-M}\in\{0,\ldots,2^m-1\} \quad (3.1)$$

After M recursion steps, the metrics $\overline{\alpha}_k(S_k)$ approach the values that would be obtained by starting the recursion from the beginning of the trellis. Now consider a backward recursion commencing at trellis step k+M. The backward state metrics are initialized as:

$$\overline{\beta}_{k+M}(S_{k+M})=0, S_{k+M}\in\{0,\ldots,2^m-1\} \quad (3.2)$$

In analogy to the forward recursion, after the same number of recursion steps M, the metrics $\overline{\beta}_k(S_k)$ approach the values that would be obtained by starting the recursion at the end of the trellis. If the acquisition depth M is too small, then the decoding performance can be severely degraded. With M above a certain value, the decoding performance is virtually optimal. The value of M that leads to a reasonable balance between computational effort and decoding performance can be determined by simulation.

The window size itself has no influence on the communication performance, but on the size of the RAM for storage of the α-state metrics. Furthermore the throughput is dependant on the ratio between acquisition length and window size. When only one state metric calculation unit is available, the individual windows are processed sequential. It takes one clock cycle for the forward recursion and one clock cycle for the backward recursion/LLR calculation per data bit. The additional computational overhead is determined by the total number of acquisition steps. If the window size is equal to the acquisition length, the decoding needs one additional clock cycle per bit, resulting in total three clock cycles per bit. If the window size is much larger than the acquisition length, the computational overhead goes near zero, resulting in a throughput of nearly two. So the choice of the window size is a trade off between memory size and throughput.

4. Combined Implementation of Convolutional and Turbo Decoder

Figure 5:
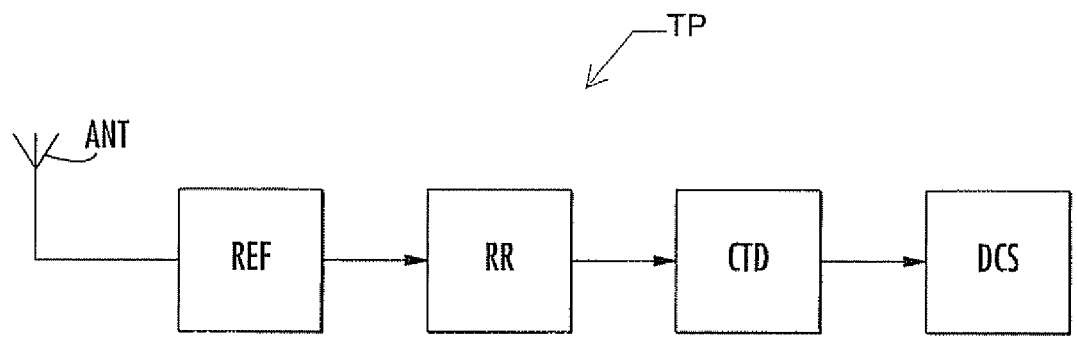
FIG. 5 shows a receiving chain of a mobile phone including a combined decoder according to the invention.

We refer now to FIG. 5 which illustrates a combined decoder according to the invention which is incorporated in the reception chain of a cellular mobile phone TP.

The encoded signal is being received by the antenna ANT and processed by the radio frequency stage REF of the receiver. At the output of the REF stage, the signal is converted into the digital domain by an A/D converter. The digital base band signal is then processed by a rake demodulator which is generally used in a CDMA system.

Then, the channel decoding stage includes a combined turbo-code/convolutional code decoder CTD according to the invention. The processing chain comprises also a source decoding block DCS, which performs the source decoding treatments.

The encoded signal is being received by the antenna ANT and processed by the radio frequency stage REF of the receiver. At the output of the REF stage, the signal is converted into the digital domain by an A/D converter. The digital base band signal is then processed by a rake demodulator RR which is generally used in a CDMA system.

The following Table 1 shows the different major RAM requirements for CC and TC, assuming a window size of 64 for both decoders, 6 bit input quantization and 11 bit state metric quantization

TABLE 1

| Purpose | Number | Convolutional | | Turbo | |
|---|---|---|---|---|---|
| | | Words | Bits | Words | Bits |
| Input/Output | 4 | 512 | 6 | 5120 | 6 |
| α-RAM window size = 64 | 1 | 32*64 = 2048 | 88 | 64 | 88 |

4.1 General Architecture of the Combined Decoder

Figure 6:
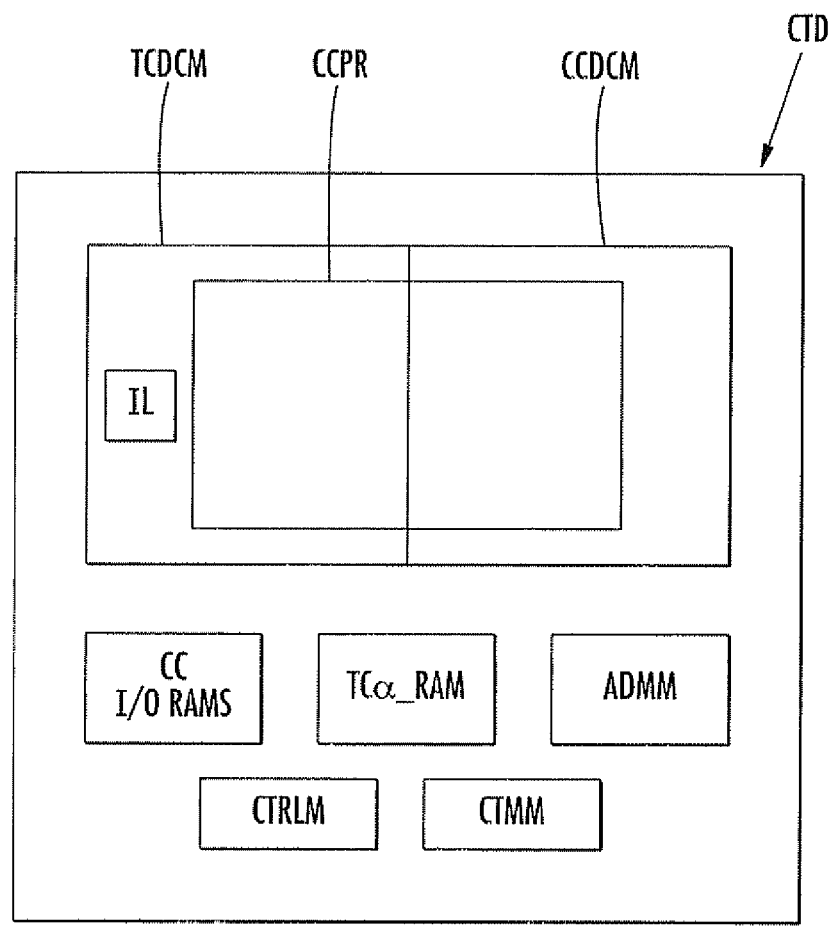
FIG. 6 shows diagrammatically the internal structure of a combined decoder according to the invention.

The combined decoder CTD according to the invention, as illustrated in FIG. 6, comprises turbo-code decoding means TCDCM for performing turbo-code decoding, and convolutional code processing means CCDCM for performing convolutional code.

Turbo-code and convolutional code decoding means comprise common processing means CCPR implementing a MAP algorithm and having a first configuration dedicated to turbo-code decoding and a second configuration dedicated to convolutional code decoding. The common processing means the CCPR or MAP unit form a Soft-in-Soft-out unit (SISO unit) on which MAP1 and MAP2 operations are done serially for turbo decoding, until a stop criteria is fulfilled.

Further to these common processing means, the turbo-code decoding means TCDM comprises conventional interleaving means IL. Moreover, the combined decoder CTD comprises metrics memory means referenced as TC alpha-PAM for storing forward state metrics associated to the states of a first trellis (8 states here). The forward state metrics is delivered by the processing means CCPR in its first configuration (turbo decoding).

Input/output memory means referenced as CC I/O RAMs are provided for storing input and output data delivered to and by the processing means CCPR in its second configuration, i.e., for CC decoding.

At last, adaptable memory means ADMM are used for storing input and output data delivered to and by the processing means CCPR in its first configuration (turbo-code decoding), and for storing forward state metrics associated to the states of a second trellis (256 states here) and delivered by the processing means CCPR in its second configuration (convolutional code decoding).

Control means CTRLM configurate the common processing means CCER in its first or second configuration depending on the kind of code, and memory control means CTMM address differently the adaptable memory means ADMM depending on the configuration of the common processing means CCPR.

4.2 Architecture of the Common Processing Means CCPR

Figure 7:
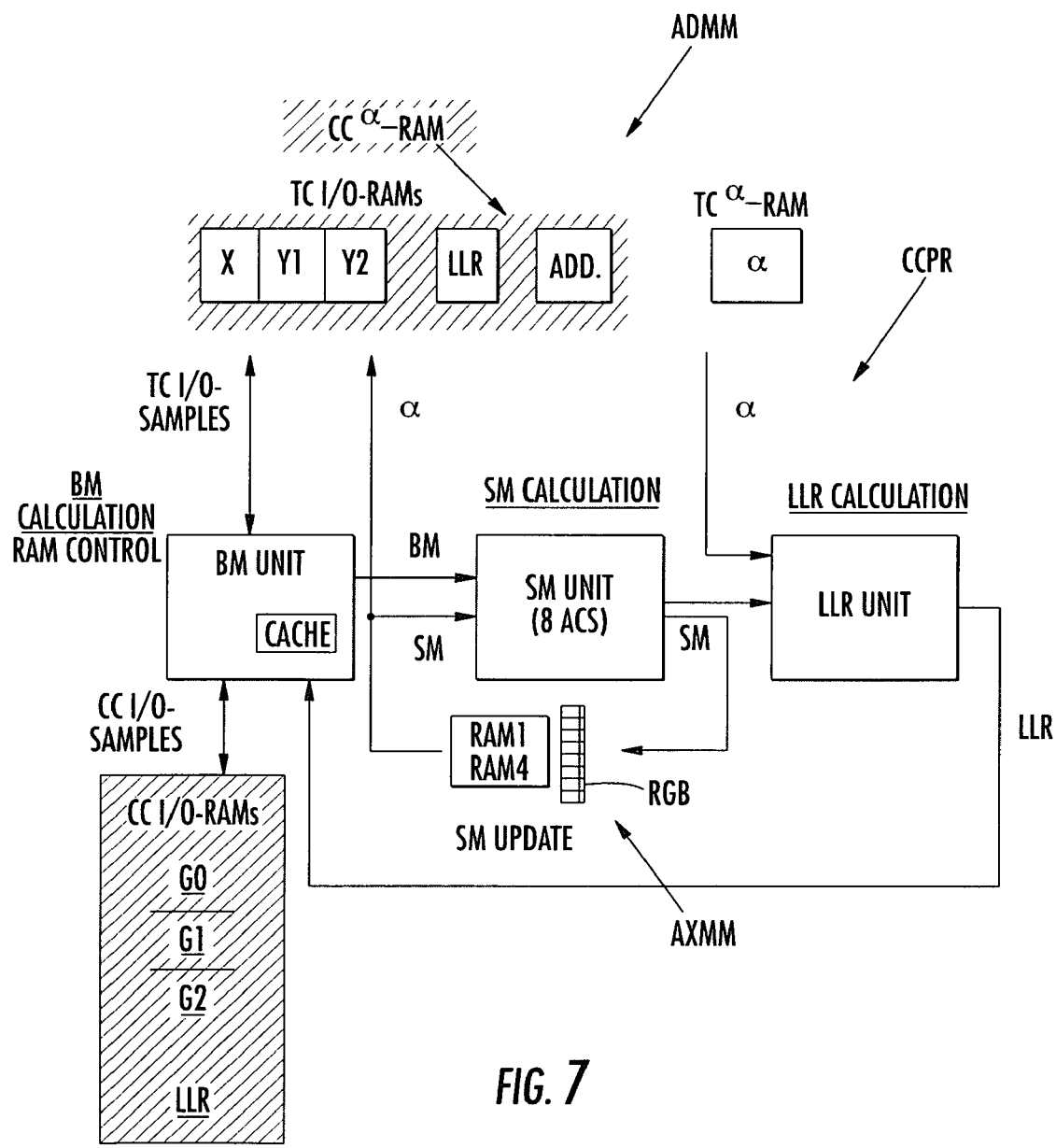
FIG. 7 shows in more detail part of a combined decoder according to the invention.

FIG. 7 illustrates in more detail the internal structures of the common processing means CCPR.

The processing means CCPR comprise essentially three major calculation units, i.e., the BM unit that calculates the branch metrics BM and controls the complete I/O RAMs and alpha RAM; the state metric unit which calculates 8 state metrics SM in parallel with 8 add-compare-select (ACS) units; and the LLR unit which calculates the LLRs in a pipelined manner.

4.3 Input/Output Memory Means CC I/O Rams for Convolutional Decoding

The input RAMs include three RAMs referenced as G0_RAM, G1_RAM and G2_RAM according to the respective CC input data. Output RAM is CCLLR_RAM. The RAM-sizes are 512*6 bits.

4.4 Metrics Memory Means TCα-RAM for Turbo Decoding

The alpha state metric RAM for TC decoding is a dedicated 64*88 bit RAM (alpha_RAM).

4.5 Adaptable Memory Means ADMM

The adaptable memory means ADMM is used either for storing input and output data for turbo-code decoding or for storing forward state metrics in the convolutional code decoding.

Figure 8:
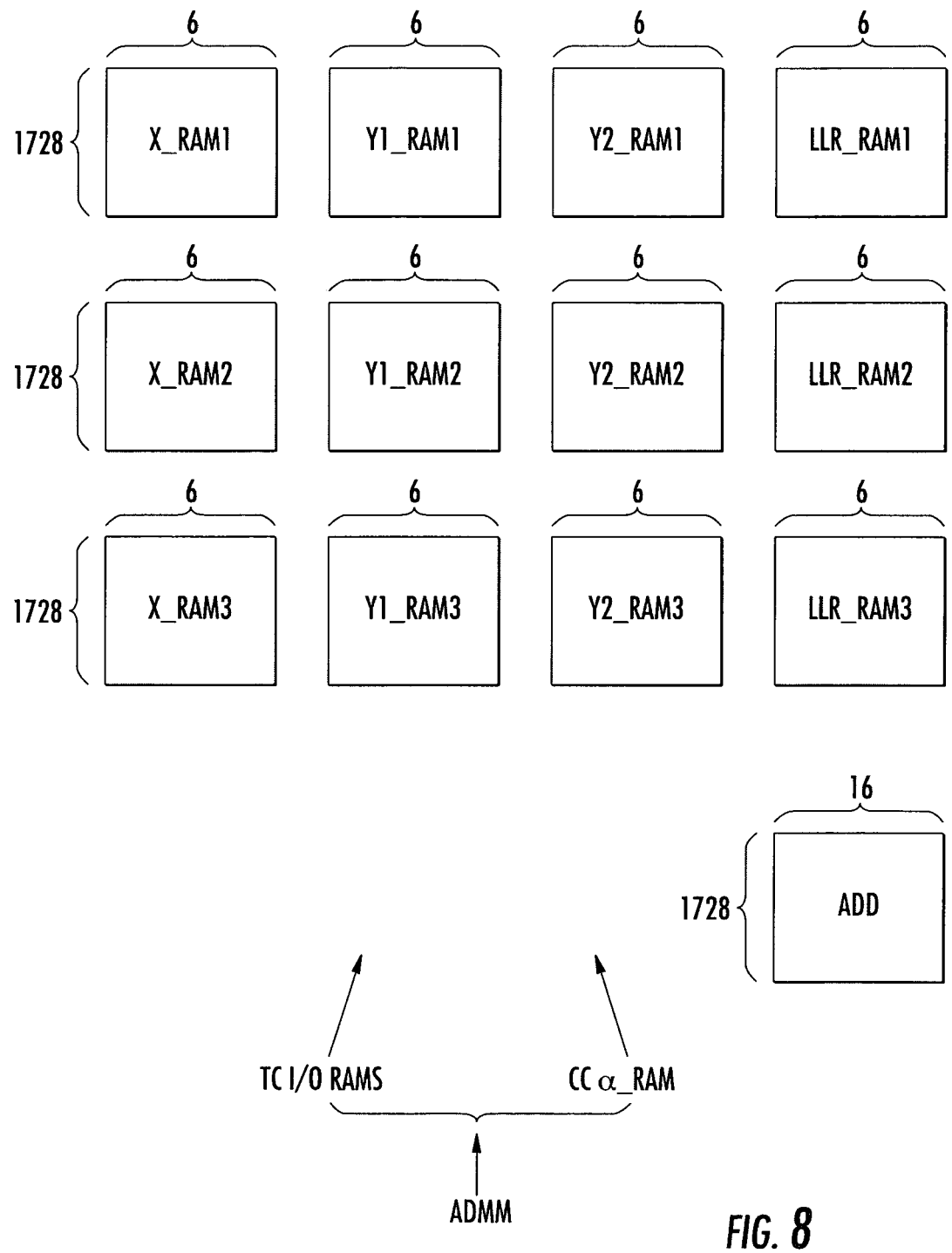
FIG. 8 shows more in detail an adaptable memory belonging to a combined decoder according to the invention.

As shown in FIG. 8, these adaptable memory means comprises a lot of elementary memories as well as an additional memory means ADD.

More precisely, in the present application, the turbo-code decoding means are adapted to receive successive sequences of N1 symbols (N1=5120) of b1 bits (b1=6). The input and output data delivered to and by the processing means CCPR in its first configuration (turbo decoding) comprises for each received sequence, g different blocks of N1 words of b1 bits. Here, g=4 and these g blocks are the systematic input data X; the parity input data Y1; the interleaved parity input data Y2; and the decisions of the decoding, as output data.

The forward state metrics to be stored in the adaptable memory means (when convolutional code decoding) is a block of N2 words (N2=1728) of b2 bits, with b2 being greater than b1. Generally, the product N2 times b2 is equal to the product of W (window size) with the number of states of the trellis, and with the number of bits for each state. In the present case, W is equal to 54 or the convolutional code, 64 for the turbo-code. The number of states is equal to 8 for the turbo-code and to 256 for the convolutional code. The number of bits for each state is equal to 11. Accordingly, N2 is equal to 1728 whereas b2 is equal to 88.

Thus, as shown in FIG. 8, the main memory means of the adaptable memory means ADMM comprises 4 groups of p (p=4) elementary memories respectively dedicated to the g blocks of N1 words. Each elementary memory is adapted to store N2 words of b1 bits. The additional memory ADD is adapted to store 1728 words of 16 bits.

Generally speaking, the memory control means address the adaptable memory means ADMM in the first configuration (turbo-code decoding) such that each block of 5120 words of 6 bits is written in or read from its dedicated group of 3 elementary memories.

Further, the memory control means address the adaptable memory means ADMM in the second configuration (convolutional code decoding) such that the twelve elementary words of the forward state metrics are respectively stored in the twelve elementary memories of the main memory means at the same address. The additional elementary word of the forward state metrics (the 16 other bits) is stored in the additional memory means at the same address.

In other words, for CC decoding each of the I/O RAMs of the TC is split into 3 separate RAMs. These RAMs are concatenated to form the required bitwidth for the storage of 8 state metrics in parallel. We need 88 bits (8*11 bits), the I/O RAMs are 6 bit wide so we get 4*3*6 bit=72 bit. Therefore we need an additional 16 bit RAM to form the CC alpha RAM. This RAM sharing enables us to get a sufficient window size for CC decoding.

As shown in FIG. 8, the naming conventions are as follows: the systematic input data is stored in X_RAM1, X_RAM2, X_RAM3; the parity input data is stored in Y1_RAM1, Y1_RAM2, Y1_RAM3; and the interleaved parity input data is stored in Y2_RAM1, Y2_RAM2, Y2_RAM3.

The TC output RAMs are LLR_RAM1, LLR_RAM2 and LLR_RAM3. The MSB represents the output hard decision, whereas the LSB represent the extrinsic information/LLR soft decision (depending on actual decoding progress). This enables a stopping of the decoding after MAP1 CRC check.

Because the RAMs are split into three, an appropriate address transformation is done to map the address space 0-5119 to three times 0-1727. This value is rounded up to the minimum feasible RAM. Only the actual needed RAMs are activated, all others are deselected.

4.6 Calculation of the Branch Metrics

The common processing means comprises a branch metric unit for calculating in each first and second configurations the branch metrics associated to the branches of the corresponding trellis (see eq. 2.16 for turbo code).

The transfer of TC input data samples to the CTD decoder is done in the following order:

$$X_1, Y_1^1, Y_1^2, X_2, Y_2^1, Y_2^2, \ldots X_{B_i}, Y_{B_i}^1, Y_{B_i}^2, \text{TailBits}$$

$B_i$ is the number of bits in the $i^{-th}$ code block. The storage of the tail bits has to be considered, the transmitted bits for the trellis termination are: $x_{K+1}, z_{K+1}, x_{K+2}, z_{K+2}, x_{K+3}, z_{K+3}, x'_{K+1}, z'_{K+1}, x'_{K+2}, z'_{K+2}, x'_{K+3}, z'_{K+3}$; where $Y^1=z$, $Y^2=z'$ and $x'=X^{Second\ encoder}$, K=block length.

The parity data RAMs Y1 and Y2 are filled sequentially. The respective three tail bits are just appended. The systematic data RAM X is also filled sequentially, because there are six tail bits in total. The tail bits for the first encoder are appended first, then the tail bits for the second encoder follow.

The input sequence for CC decoding is simpler, because there is only one tail sequence. The tail bits are just appended to the respective RAM.

The different steps of the windowing scheme can be divided into further sub-steps. The calculation of the branch metrics is the prerequisite for the calculation of the state metrics. The memory control means therefore addresses the input RAMs to calculate the respective branch metrics. We use the optimized MAP calculation scheme proposed above. The naming convention used is based on the binary representation of the pair [systematic/parity information] ∈{0,1} resp. [G0/G1], [G0/G1/G2]. X, Y, LLR, G0, G1, G2 represent the individual data stored in the RAMs (e.g., the content of the LLR-RAM is the extrinsic information).

Turbo Code:
branch0=0
branch1=Y
branch2=X+LLR
branch3=X+Y+LLR

Convolutional Code, rate ½:
branch0=0
branch1=G1
branch2=G0
branch3=G1+G0

Convolutional Code, rate ⅓:
branch0=0
branch1=G2
branch2=G1
branch3=G1+G2
branch4=G0
branch5=G0+G2
branch6=G0+G1
branch7=G0+G1+G2

The branch metric calculation is very simple, two additions for TC and one resp. four additions (calculation of branch7 reuses a previous addition, e.g., G0+G1) for CC. In case of TC we have to use interleaved data during the MAP2 operation. Therefore the BM unit interacts with the external interleaver to fetch the appropriate addresses. To avoid data collisions during forward and backward TC recursion, a dedicated LLR-cache is needed as well as a dedicated LLR-register. This will be explained by a simple example.

Figure 9:
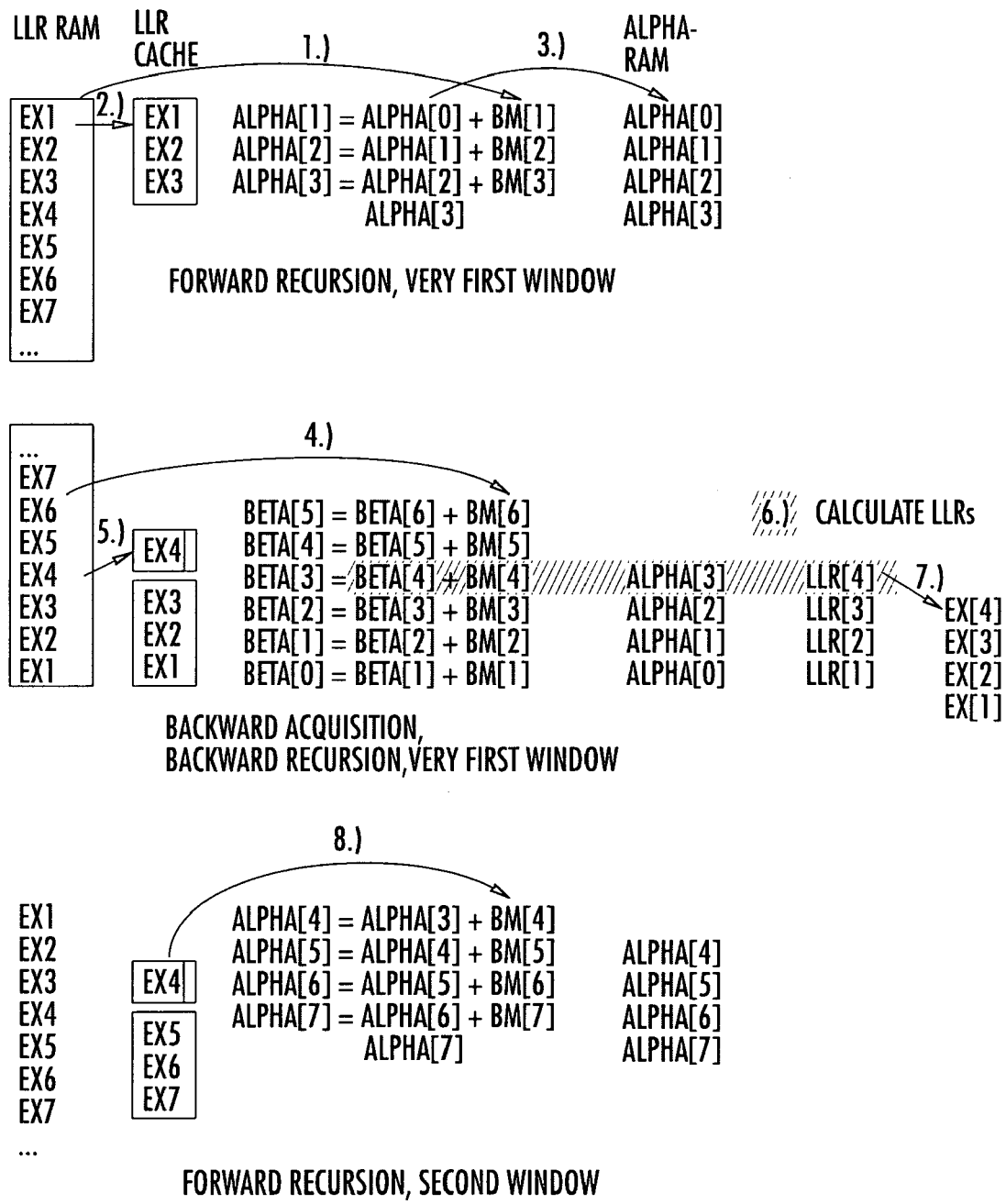
FIG. 9 shows an example for read-write access during a windowing scheme according to the prior art.

FIG. 9 shows the calculation scheme for a supposed window length of four. The forward recursion of the first window is always special, as only 3 alpha state metrics are calculated, because the initialization state metric alpha[0] is also stored in the alpha RAM, together with the new calculated alpha[1] to alpha[3]. We start by calculating branch metric bm[1]. This requires reading of the extrinsic information ex1 from the LLR RAM (step 1). This extrinsic information is also stored in the LLR cache (step 2). When calculating the first alpha state metric alpha[1], we also store the previous state metric alpha[0] into the alpha-RAM (step 3). This is repeated until all 4 alpha state metrics are stored.

Now the beta acquisition starts by calculating beta[5]. Thus we need to calculate branch metric bm[6], therefore reading ex6 from the LLR RAM (step 4). After recursively calculating beta[4], the regular backward recursion starts with calculation of beta[3], thus reading ex4 for branch metric bm[4]. Note that ex4 is also stored in a separate register for later usage (step 5). For the remaining beta recursion steps, the extrinsic information for branch metric calculation is read from the LLR cache, because new extrinsic information is calculated in parallel. This is shown in step 6. In parallel to calculation of beta[3], LLR[4] is calculated by reading alpha[3] from the alpha-RAM. From this LLR [4], the new ex4 is calculated in step 7 and stored in the LLR RAM, thus overwriting the previous 'old' ex4. So the introduction of a special LLR cache enables parallel reading (for branch metric calculation) and writing (new calculated extrinsic information) of extrinsic information.

After finishing the beta recursion, the next forward recursion starts with the second window. Calculation of alpha[4] needs branch metric bm[4]. Branch metric bm[4] itself needs ex4, which was just overwritten in the LLR RAM during beta recursion. Therefore we use the previously registered ex4 to calculate the branch metric (step 8). Then the forward recursion proceeds by reading ex5 from the LLR RAM, buffering ex5 into the LLR cache, storing alpha[4] in the alpha RAM etc., according to steps 1–3.

During backward/LLR operation the 'old' extrinsic information for the branch metric calculation are read from the cache because we write at the same time the 'new' extrinsic information. Furthermore the first calculated and stored 'new' extrinsic information overwrites a still needed value for the following forward recursion, the previous extrinsic information (ex4) has to be buffered in a register.

So the extrinsic information for calculating the TC branch metrics can have four different sources in total: extrinsic information from LLR RAM; extrinsic information from LLR cache; extrinsic information from llr_old register; and extrinsic information set to zero during the very first MAP1 operation. Since the CC decoding is not iterative, i.e., no feedback loop, there is no need for the LLR cache.

4.7 Calculation of the State Metrics

Turning now to the calculation of the state metrics, the common processing means comprises a configurable state metrics unit SM.

Figure 10:
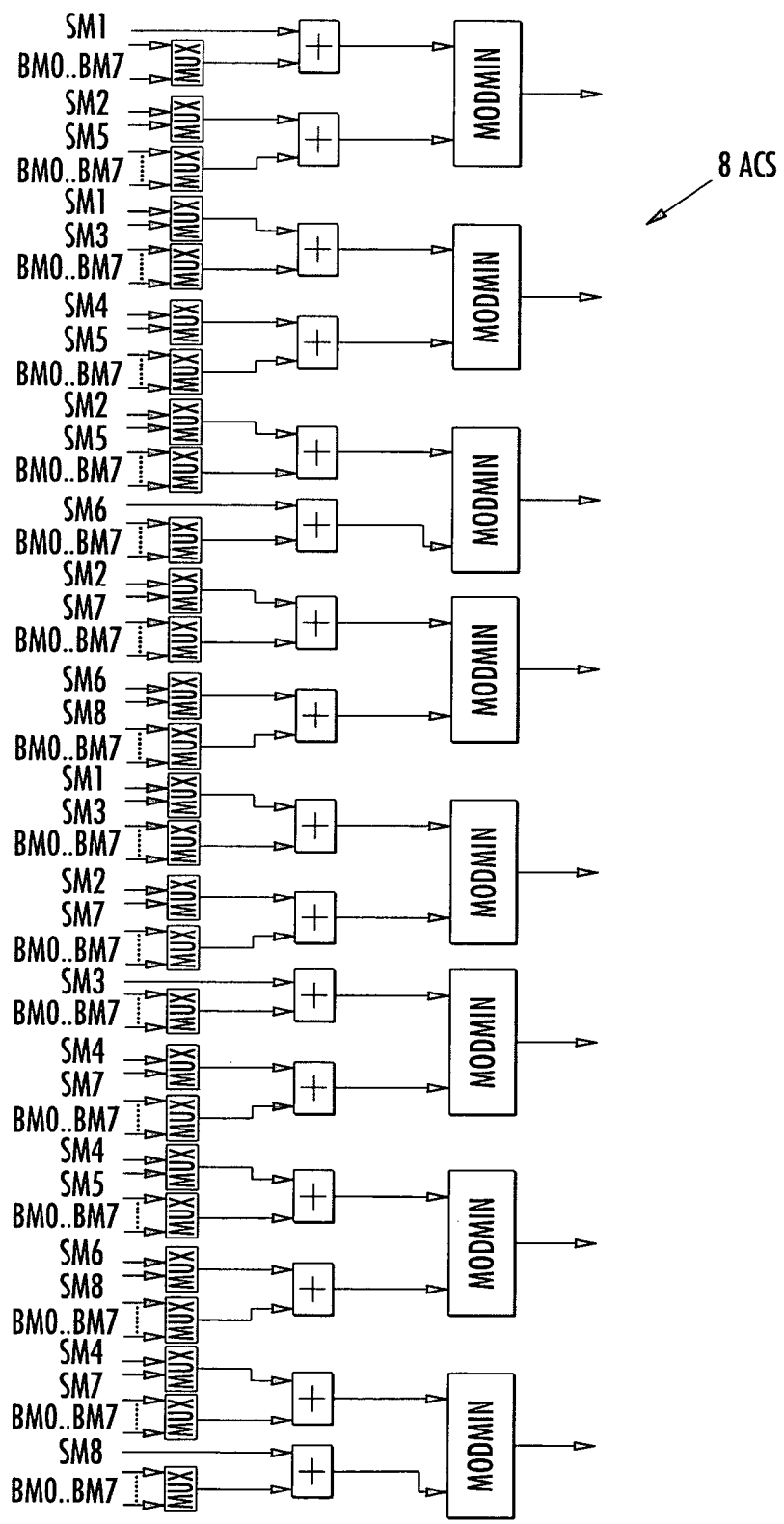
FIG. 10 shows diagrammatically an ACS unit architecture according to the prior art.
Figure 11:
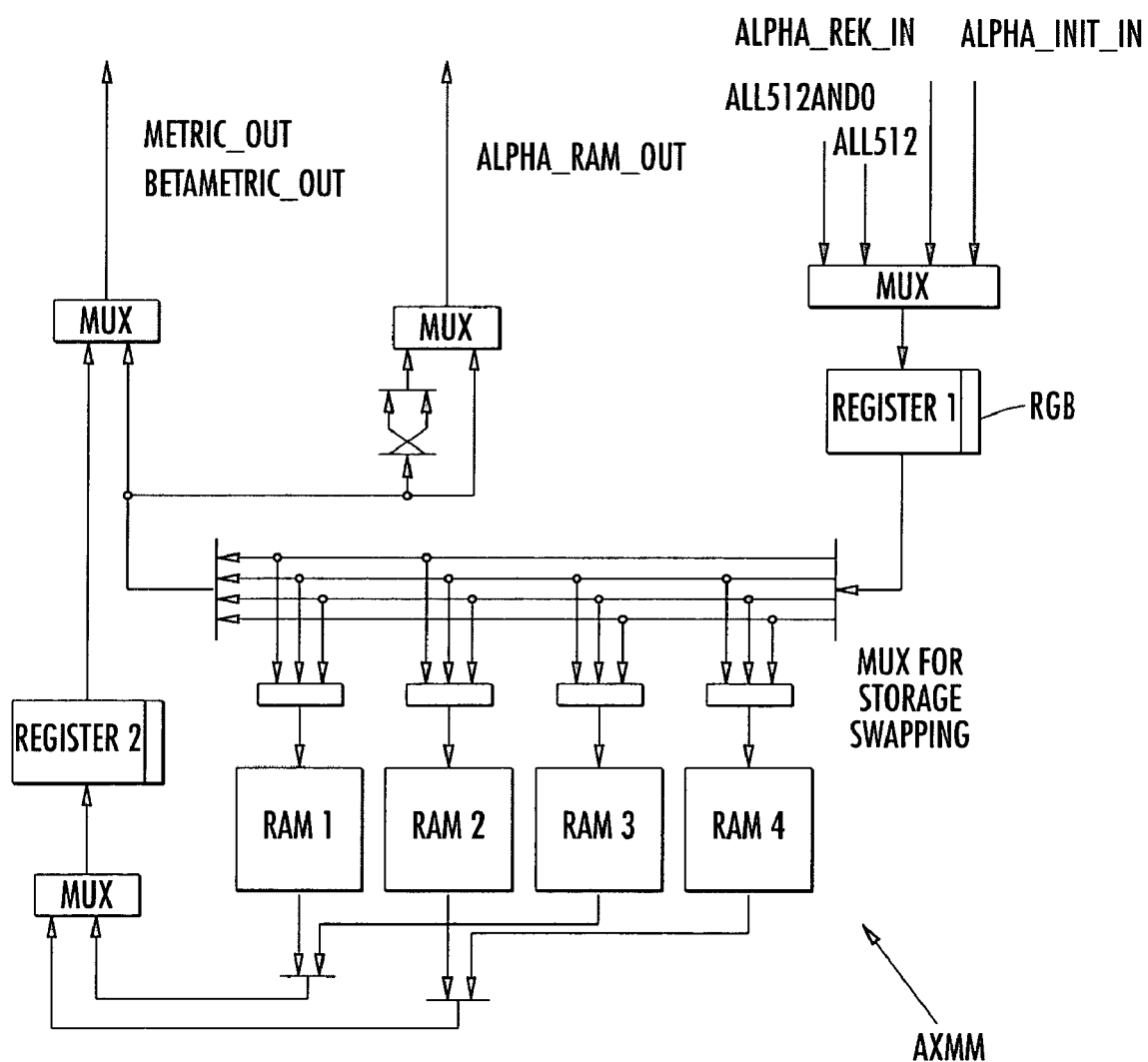
FIG. 11 shows diagrammatically the structure of an ACS update unit according to the prior art.

As shown in FIGS. 7, 10, and 11, the configurable state metrics units SM comprises an architecture of 8 parallel ACS (Add, Compare, Select) units for calculating in each configuration 8 forward state metrics. Auxiliary memory means (AXMM) for temporarily storing the calculated forward state metrics for a recursive calculation. Auxiliary control means control the storage of the metrics in the auxiliary memory means depending on the configuration of the common processing means.

Turbo-Code:

| | sm1 | sm2 | sm3 | sm4 | sm5 | sm6 | sm7 | sm8 |
|---|---|---|---|---|---|---|---|---|
| forward | alpha[1] | alpha[2] | alpha[3] | alpha[4] | alpha[5] | alpha[6] | alpha[7] | alpha[8] |
| backward | beta[1] | beta[2] | beta[3] | beta[4] | beta[5] | beta[6] | alpha[7] | beta[8] |

Convolutional Code:

| | sm1 | sm2 | sm3 | sm4 | sm5 | sm6 | sm7 | sm8 |
|---|---|---|---|---|---|---|---|---|
| forward, first 3 steps | alpha[0] alpha[132] alpha[8] | alpha[1] alpha[133] alpha[9] | alpha[2] alpha[134] alpha[10] | alpha[3] alpha[135] alpha[11] | alpha[128] alpha[4] alpha[136] | alpha[129] alpha[5] alpha[137] | alpha[130] alpha[6] alpha[138] | alpha[131] alpha[7] alpha[139] |
| backward, first 3 steps | beta[1] beta[9] beta[17] | beta[2] beta[10] beta[18] | beta[3] beta[11] beta[19] | beta[4] beta[12] beta[20] | beta[5] beta[13] beta[21] | beta[6] beta[14] beta[22] | alpha[7] alpha[15] alpha[23] | beta[8] beta[16] beta[24] |

4.8 ACS Architecture

More precisely, the ACS architecture illustrated in FIG. 10 calculates eight state metrics in parallel out of the branch metrics and the previous state metrics according to equation 2.13 and 2.14. This is done with 8 ACS (Add, Compare, Select) units based on a modmin-procedure (the MODMIN blocks perform the min* operator).

This ACS architecture is used for forward as well as for backward recursion for both turbo code and convolutional code. Because of the different trellis diagrams, the flexibility is achieved with multiplexers for the incoming branch metrics (bmux) and state metrics (smux). These multiplexers are controlled externally as explained thereafter.

The eight ACS units need sixteen branch metric+state metric sums, therefore sixteen bmux multiplexers are provided. Each of these bmux multiplexers can select among eight branch metrics (because CC rate ⅓ needs eight different branch metrics in total). However, because of a particular state metric distribution not sixteen but only twelve smux state metric multiplexers are needed. Furthermore this state metric distribution leads to only 2:1 smux multiplexers, because the setting is valid for either CC forward recursion/TC backward recursion or CC backward/TC forward recursion. There is no additional multiplexing of the calculated state metrics. In case of forward recursion, the new state metrics are always in ascending order. FIG. 10 shows the general architecture of the ACS architecture. Sm1–sm8 denote the 8 parallel input state metrics at one time step, bm0–bm7 denote the up to 8 different branch metrics. The smux setting for TC forward/CC backward is marked bold. The output of this unit are the new state metrics as well as the llr-metrics (βestate metric+branch metric) for the LLR calculation.

The multiplexing scheme for the state metrics will be illustrated with some simple examples of the assignment of input state metrics sm1–sm8:

Using this assignment, only the mentioned twelve state metric multiplexer are necessary. So regarding the setting for TC forward recursion, the sixteen state metric settings from top to bottom according to FIG. 10 are:
sm1, sm2, sm3, sm4, sm5, sm6, sm7, sm8, sm1, sm2, sm3, sm4, sm5, sm6, sm7, sm8, thus resulting in:

$\text{alpha}[1][n+1] = \min(\text{alpha}[1][n] + bm[0][n], \text{alpha}[2][n] + bm[3][n])$ $\text{alpha}[2][n+1] = \min(\text{alpha}[3][n] + bm[2][n], \text{alpha}[4][n] + bm[4][n])$ $\text{alpha}[3][n+1] = \min(\text{alpha}[5][n] + bm[1][n], \text{alpha}[6][n] + bm[2][n])$ $\text{alpha}[4][n+1] = \min(\text{alpha}[7][n] + bm[3][n], \text{alpha}[8][n] + bm[0][n])$ $\text{alpha}[5][n+1] = \min(\text{alpha}[1][n] + bm[3][n], \text{alpha}[2][n] + bm[0][n])$ $\text{alpha}[6][n+1] = \min(\text{alpha}[3][n] + bm[1][n], \text{alpha}[4][n] + bm[2][n])$ $\text{alpha}[7][n+1] = \min(\text{alpha}[5][n] + bm[2][n], \text{alpha}[6][n] + bm[1][n])$ $\text{alpha}[8][n+1] = \min(\text{alpha}[7][n] + bm[0][n], \text{alpha}[8][n] + bm[3][n])$ Analogous the setting for TC backward recursion is sm1, sm5, sm1, sm5, sm2, sm6, sm2, sm6, sm3, sm7, sm3, sm7, sm4, sm8, sm4, sm8, thus resulting in:

$\text{beta}[1][n] = \min(\text{beta}[1][n+1] + bm[0][n+1], \text{beta}[5][n+1] + bm[3][n+1])$ $\text{beta}[2][n] = \min(\text{beta}[1][n+1] + bm[3][n+1],$ $\text{beta}[5][n+1] + bm[0][n+1])$ $\text{beta}[3][n] = \min(\text{beta}[2][n+1] + bm[2][n+1],$ $\text{beta}[6][n+1] + bm[1][n+1])$ -continued $\text{beta}[4][n] = \min(\text{beta}[2][n+1] + bm[1][n+1],$ $\text{beta}[6][n+1] + bm[2][n+1])$ $\text{beta}[5][n] = \min(\text{beta}[3][n+1] + bm[1][n+1],$ $\text{beta}[7][n+1] + bm[2][n+1])$ $\text{beta}[6][n] = \min(\text{beta}[3][n+1] + bm[2][n+1],$ $\text{beta}[7][n+1] + bm[1][n+1])$ $\text{beta}[7][n] = \min(\text{beta}[4][n+1] + bm[3][n+1],$ $\text{beta}[8][n+1] + bm[0][n+1])$ $\text{beta}[8][n] = \min(\text{beta}[4][n+1] + bm[0][n+1],$ $\text{beta}[8][n+1] + bm[3][n+1])$ The auxiliary memory AXMM temporally stores the calculated state metrics for the recursive calculation. In case of TC decoding this is a simple register bank RGB for the new calculated state metrics.

The CC decoding means uses the register bank as well, but also two pairs of supplementary memories RAM1–RAM4 (FIG. 11) as explained below. Since 8 states are calculated in parallel, we have to read 8 state metrics and write 8 state metrics. The read and write scheme should be as regular as possible to simplify the address generation. Furthermore a suitable data ordering is necessary to avoid data collision. This can be explained for example by looking at a part of the trellis diagram of the forward recursion, code rate ½, as shown below.

forward recursion CC rate=½

$\text{alpha}[0][n+1] = \min(\text{alpha}[0][n] + bm[0][n], \text{alpha}[128][n] + bm[3][n])$ $\text{alpha}[1][n+1] = \min(\text{alpha}[0][n] + bm[3][n], \text{alpha}[128][n] + bm[0][n])$ $\text{alpha}[2][n+1] = \min(\text{alpha}[1][n] + bm[1][n], \text{alpha}[129][n] + bm[2][n])$ $\text{alpha}[3][n+1] = \min(\text{alpha}[1][n] + bm[2][n], \text{alpha}[129][n] + bm[1][n])$ $\text{alpha}[4][n+1] = \min(\text{alpha}[2][n] + bm[3][n], \text{alpha}[130][n] + bm[0][n])$ $\text{alpha}[5][n+1] = \min(\text{alpha}[2][n] + bm[0][n], \text{alpha}[130][n] + bm[3][n])$ $\text{alpha}[6][n+1] = \min(\text{alpha}[3][n] + bm[2][n], \text{alpha}[131][n] + bm[1][n])$ $\text{alpha}[7][n+1] = \min(\text{alpha}[3][n] + bm[1][n], \text{alpha}[131][n] + bm[2][n])$ $\text{alpha}[8][n+1] = \min(\text{alpha}[4][n] + bm[3][n], \text{alpha}[132][n] + bm[0][n])$ When calculating and writing the actual state metrics $\text{alpha}_{(n+1)}$ [0–7] we have to read $\text{alpha}_{(n)}$ [0–3] and $\text{alpha}_{(n)}$ [128–131]. We can not read one $\text{alpha}_{(n)}$ [0–3,128–131] word and write one $\text{alpha}_{(n+1)}$ [0–7] word because at step n+2 we need $\text{alpha}_{(n+1)}$ [0–3, 128–131] again. Furthermore we do not want different word sequences because this would not comply with the simple 2:1 smux concept of the ACS architecture. Therefore a suitable state metric word split as well as a suitable state metric word sequence are used. This is done with total four RAMs, (RAM1–RAM4) where two RAMs serve as data source and two RAMs serve as data sink. After calculating all 256 state metrics of one time step, the RAM direction is switched. This takes 34 clock cycles.

The RAM access sequences are given below and will be explained in the following.

| RAM1 | | RAM2 | | RAM3 | | RAM4 | |
|---|---|---|---|---|---|---|---|
| Addr | Data Read | Addr | Data Write | Addr | Data Read | Addr | Data Write |
| 0 | 0–3 | | | 16 | 128–131 | | |
| 16 | 132–135 | 0 | 0–3 | 0 | 4–7 | 0 | 4–7 |
| 1 | 8–11 | 1 | 8–11 | 17 | 136–139 | 1 | 12–15 |
| 17 | 140–143 | 2 | 16–19 | 1 | 12–15 | 2 | 20–23 |
| 2 | 16–19 | 3 | 24–27 | 18 | 144–147 | 3 | 28–31 |
| 18 | 148–151 | 4 | 32–35 | 2 | 20–23 | 4 | 36–39 |
| 3 | 24–27 | 5 | 40–43 | 19 | 152–155 | 5 | 44–47 |
| 19 | 156–159 | 6 | 48–51 | 3 | 28–31 | 6 | 52–55 |
| 4 | 32–35 | 7 | 56–59 | 20 | 160–163 | 7 | 60–63 |
| 20 | 164–167 | 8 | 64–67 | 4 | 36–39 | 8 | 68–71 |
| 5 | 40–43 | 9 | 72–75 | 21 | 168–171 | 9 | 76–79 |
| 21 | 172–175 | 10 | 80–83 | 5 | 44–47 | 10 | 84–87 |
| 6 | 48–51 | 11 | 88–91 | 22 | 176–179 | 11 | 92–95 |
| 22 | 180–183 | 12 | 96–99 | 6 | 52–55 | 12 | 100–103 |
| 7 | 56–59 | 13 | 104–107 | 23 | 184–187 | 13 | 108–111 |
| 23 | 188–191 | 14 | 112–115 | 7 | 60–63 | 14 | 116–119 |
| 8 | 64–67 | 15 | 120–123 | 24 | 192–195 | 15 | 124–127 |
| | | | start with swapping | | | | |
| 24 | 196–199 | 16 | 132–135 | 8 | 68–71 | 16 | 128–131 |
| 9 | 72–75 | 17 | 140–143 | 25 | 200–203 | 17 | 136–139 |
| 25 | 204–207 | 18 | 148–151 | 9 | 76–79 | 18 | 144–147 |
| 10 | 80–83 | 19 | 156–159 | 26 | 208–211 | 19 | 152–155 |
| 26 | 212–215 | 20 | 164–167 | 10 | 84–87 | 20 | 160–163 |
| 11 | 88–91 | 21 | 172–175 | 27 | 216–219 | 21 | 168–171 |
| 27 | 220–223 | 22 | 180–183 | 11 | 92–95 | 22 | 176–179 |
| 12 | 96–99 | 23 | 188–191 | 28 | 224–227 | 23 | 184–187 |
| 28 | 228–231 | 24 | 196–199 | 12 | 100–103 | 24 | 192–195 |
| 13 | 104–107 | 25 | 204–207 | 29 | 232–235 | 25 | 200–203 |
| 29 | 236–239 | 26 | 212–215 | 13 | 108–111 | 26 | 208–211 |
| 14 | 112–115 | 27 | 220–223 | 30 | 240–243 | 27 | 216–219 |
| 30 | 244–247 | 28 | 228–231 | 14 | 116–119 | 28 | 224–227 |

-continued

| RAM1 | | RAM2 | | RAM3 | | RAM4 | |
|---|---|---|---|---|---|---|---|
| Addr | Data Read | Addr | Data Write | Addr | Data Read | Addr | Data Write |
| 15 | 120–123 | 29 | 236–239 | 31 | 248–251 | 29 | 232–235 |
| 31 | 252–255 | 30 | 244–247 | 15 | 124–127 | 30 | 240–243 |
|  |  | 31 | 252–255 |  |  | 31 | 248–251 |

RAM Access Sequence for CC, Forward Recursion

| RAM1 | | RAM2 | | RAM3 | | RAM4 | |
|---|---|---|---|---|---|---|---|
| Addr | Data Read | Addr | Data Write | Addr | Data Read | Addr | Data Write |
| 0 | 0–3 |  |  | 0 | 4–7 |  |  |
| 1 | 8–11 | 0 | 0–3 | 1 | 12–15 | 16 | 128–131 |
| 2 | 16–19 | 16 | 132–135 | 2 | 20–23 | 0 | 4–7 |
| 3 | 24–27 | 1 | 8–11 | 3 | 28–31 | 17 | 136–139 |
| 4 | 32–35 | 17 | 140–143 | 4 | 36–39 | 1 | 12–15 |
| 5 | 40–43 | 2 | 16–19 | 5 | 44–47 | 18 | 144–147 |
| 6 | 48–51 | 18 | 148–151 | 6 | 52–55 | 2 | 20–23 |
| 7 | 56–59 | 3 | 24–27 | 7 | 60–63 | 19 | 152–155 |
| 8 | 64–67 | 19 | 156–159 | 8 | 68–71 | 3 | 28–31 |
| 9 | 72–75 | 4 | 32–35 | 9 | 76–79 | 20 | 160–163 |
| 10 | 80–83 | 20 | 164–167 | 10 | 84–87 | 4 | 36–39 |
| 11 | 88–91 | 5 | 40–43 | 11 | 92–95 | 21 | 168–171 |
| 12 | 96–99 | 21 | 172–175 | 12 | 100–103 | 5 | 44–47 |
| 13 | 104–107 | 6 | 48–51 | 13 | 108–111 | 22 | 176–179 |
| 14 | 112–115 | 22 | 180–183 | 14 | 116–119 | 6 | 52–55 |
| 15 | 120–123 | 7 | 56–59 | 15 | 124–127 | 23 | 184–187 |
| 16 | 132–135 | 23 | 188–191 | 16 | 128–131 | 7 | 60–63 |
|  |  |  | start with swapping |  |  |  |  |
| 17 | 140–143 | 8 | 64–67 | 17 | 136–139 | 24 | 192–195 |
| 18 | 148–151 | 24 | 196–199 | 18 | 144–147 | 8 | 68–71 |
| 19 | 156–159 | 9 | 72–75 | 19 | 152–155 | 25 | 200–203 |
| 20 | 164–167 | 25 | 204–207 | 20 | 160–163 | 9 | 76–79 |
| 21 | 172–175 | 10 | 80–83 | 21 | 168–171 | 26 | 208–211 |
| 22 | 180–183 | 26 | 212–215 | 22 | 176–179 | 10 | 84–87 |
| 23 | 188–191 | 11 | 88–91 | 23 | 184–187 | 27 | 216–219 |
| 24 | 196–199 | 27 | 220–223 | 24 | 192–195 | 11 | 92–95 |
| 25 | 204–207 | 12 | 96–99 | 25 | 200–203 | 28 | 224–227 |
| 26 | 212–215 | 28 | 228–231 | 26 | 208–211 | 12 | 100–103 |
| 27 | 220–223 | 13 | 104–107 | 27 | 216–219 | 29 | 232–235 |
| 28 | 228–231 | 29 | 236–239 | 28 | 224–227 | 13 | 108–111 |
| 29 | 236–239 | 14 | 112–115 | 29 | 232–235 | 30 | 240–243 |
| 30 | 244–247 | 30 | 244–247 | 30 | 240–243 | 14 | 116–119 |
| 31 | 252–255 | 15 | 120–123 | 31 | 248–251 | 31 | 248–251 |
|  |  | 31 | 252–255 |  |  | 15 | 124–127 |

RAM Access Sequence for CC, Backward Recursion

The numbers denote the state metrics (0 to 255), the data words are always stored sequential. This access scheme guarantees a collision free data access. Furthermore the addressing is very simple, there are only two possibilities for each RAM, which can be easily realized with an incrementer and an multiplexer for the MSB of the address, all discussed in the example below. This multiplexer is fed with the MSB of the incrementer and a Ram_high signal which can be set to '0' or '1'.

An example for the addressing of RAM1 and RAM3 is as follows:

Sequential: RAM13_adr is the address for RAM 1 and RAM 3: used during initialization of RAM 1 and RAM 3; used during alpha writing of RAM 1 and RAM 3; and used during beta reading of RAM 1 and RAM 3; and Not sequential: address is build out of 4 LSB of RAM13_adr and RAM_high signals. This is used to generate the address sequence: 0 16 1 17 2 18 3 19 4 20 . . . 14 30 15 31. This is used during alpha reading of RAM 1 and RAM 3; and is used during beta writing of RAM 1 and RAM 3.

To maintain a simple multiplexing in the ACS architecture, the calculated state metrics have to be swapped during RAM storage. As mentioned before, the alpha state metric output of the ACS architecture is always in ascending order. When looking at the access scheme for the forward recursion we recognize a change in the ordering (marked with start swapping). Instead of writing 128–131 into RAM1 and 132–135 into RAM4, these values have to be swapped because of the reading ordering. Since state metrics 128–131 are read from RAM3, they have to be stored in RAM4 for the next forward cycle. Therefore a swapping between the 44 LSB and 44 MSB of the state metric vector is done. Similar swapping is done for the beta state metrics, ensuring always the appropriate order in the RAMs.

The initialization of the state metrics is controlled by a multiplexer. Starting with the first forward recursion window of the turbo-code, the start state of the trellis is known, therefore the registers are set to all 512 and 0. This constant sets the start state zero to 0 and all other seven states to 512. The value 512 is chosen because this is the appropriate value for the modulo representation of the state metrics with bit width 11. The forward initialization for the following windows are the previously calculated and stored alpha values from the alpha-RAM. The last state of the trellis is also known, therefore the all 512 and 0 value is also chosen for initialization of the last backward recursion window. The other windows get their starting betas through an acquisition phase. The initialization for the acquisition is all 512, that means, all states are set to 512 because the actual state is unknown and therefore all states are supposed to be equal.

The scheme for decoding of the convolutional code is the same in principle, but 256 states have to be initialized. Since only 8 states can be written in parallel, the 256 states are initialized serially.

In case of TC decoding the output to the SM unit is always the register 1 content. This is also the source for the alpha-RAM.

When decoding the convolutional code the output to the alpha-RAM is always the register 1 content too, but to maintain the ordering of the alpha state metrics in the alpha-RAM they have to be swapped during the second half of the forward recursion scheme (see above). The output to the SM unit can either be from Ram1/Ram3 or RAM 2/RAM4, depending on the actual read order. Additionally the beta state metrics for calculating the LLRs are given out. Note that the ordering of the beta state metrics is equivalent to the alpha state metric ordering in the alpha-RAM.

4.9 Control of the Multiplexers

The multiplexer of the state metrics unit are controlled by a specific machine, not shown for reason of simplification.

The state metric multiplexer smux controlling is very simple. There are only two different settings, either for TC forward recursion/CC backward recursion or for TC backward recursion/CC forward recursion. The controlling of the branch metric multiplexer bmux is more complex and done in the FSM. Each sequence (32 steps) depends on the chosen rate as well as on the actual operation (forward recursion or backward recursion).

CC Rate ½ Forward Recursion:

There are 4 different sets of bmux settings, denoted A,B,C,D.

The forward sequence is

AABBCCDDAABBCCDDCCDDAABBCCDDAABB.

CC Rate ½ Backward Recursion:

There are 4 different sets of bmux settings, denoted A,B,C,D.

The backward sequence is

AABBCCDDAABBCCDDBBAADDCCBBAADDCC.

CC Rate ⅓ Forward Recursion:

There are 8 different sets of bmux settings, denoted A,B,C,D,E,F,G,H.

The forward sequence is

ABCDEFGHFEHGBADCHGFEDCBACDABGHEF.

CC rate ⅓ backward recursion

There are 8 different sets of bmux settings, denoted A,B,C,D,E,F,G,H.

The backward sequence is

ABCDEFGHFEHGBADCDCBAHGFEGHEFCDA.

4.10 The LLR Unit

Figure 12:
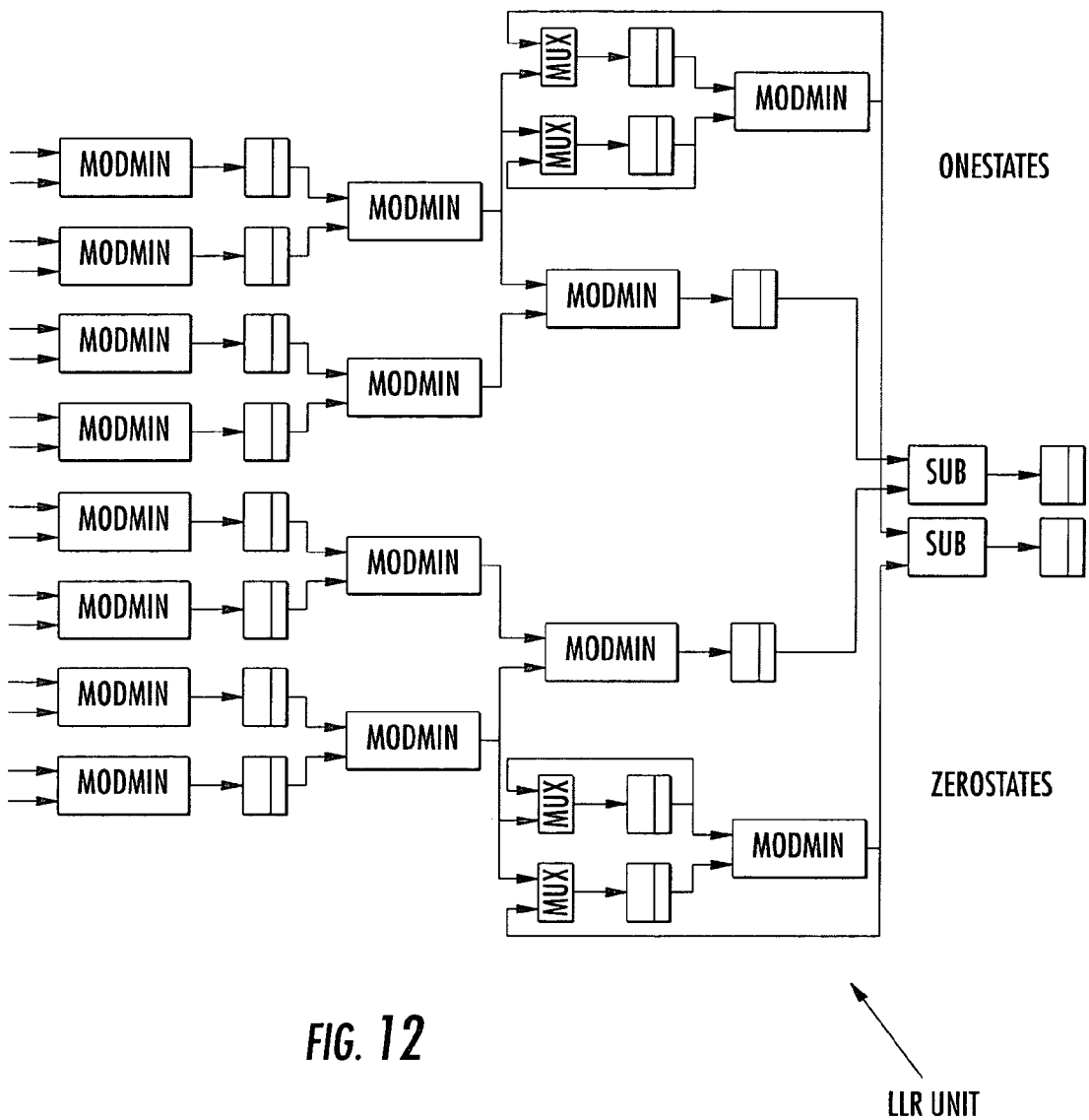
FIG. 12 shows an LLR unit belonging to a combined decoder according to the invention.

The LLR unit calculates the LLR (see eq. 2.15 for turbo code). This is done in a pipeline for the TC decoder comprising three modmin stages with registers between stage one and stage two as shown in FIG. 12. Input to the first stage are the sums alpha state metric from the alpha RAM+llrsum (=branch metric+beta state metric) from the SM unit. The values are also registered, thus resulting in a total pipeline depth of four. The upper modmin-tree calculates the minimum of all states reached by input '1' (LLR1), the lower one the minimum reached by input '0' (LLR0).

Once the LLR calculation starts, new values are present at the inputs for every clock cycle. The control is very simple and done by a simple shifting of a data valid flag through a 4 stage flip-flop pipeline.

Parts of the LLR calculation for TC are reused for convolutional decoding, see FIG. 12 (not shown are the multiplexer for the input values and the adder for calculating the sums).

More precisely, all the architecture shown on FIG. 12 is used for turbo decoding, whereas only the upper and lower parts thereof are used for convolutional code decoding. Since the encoding of the convolutional code is done with a NSC, the input '0' resp. '1' determines the state number.

Therefore we do not need the branch metrics, which simplifies the calculation to only four modmin units in the first stage. The upper two modmin units calculate the minimum of the four state metric sums reached by input '1' (one states), the lower two the minimum of input '0' (zero states). Therefore the inputs are the alpha state metrics from the alpha-RAM and the beta metrics from the AXMM memory.

Because we do not calculate all 256 states at once we need a loopback to determine the appropriate minimums. This is additional hardware compared to the turbo decoder part and situated after stage 2. The controlling is quite simple and is formed with an FSM. This can be best expressed when looking at the feedback unit for the one states. The first minimum is stored in the lower register, and the second one in the upper register. All the following minima are stored in the lower register. The resulting minimum is always in the upper register. The llr_valid flag is also generated by the FSM.

4.11 CRC-Check Unit

Figure 13:
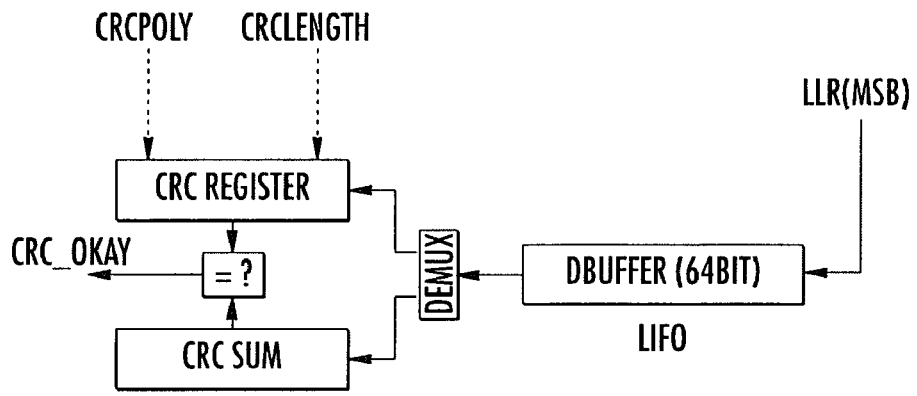
FIG. 13 shows diagrammatically a CRC check architecture of a combined decoder according to the invention.

The decoder according to the invention also comprises a specific unit which forms a CRC register dependent on the parameter CRC length and CRC poly (FIG. 13). This CRC register is used to perform a CRC check during the MAP1 operation. CRC check during the MAP2 operation is not possible because of the interleaving. The CRC sum is attached to the data block during encoding in a reverse order. Therefore the following steps have to be made:

The CRC sum of the decoded bits is done by shifting block length-CRC length bits into the CRC register; and The content of the CRC register is then compared with the decoded bits of CRC length; When equal, the CRC check is positive.

Figure 14:
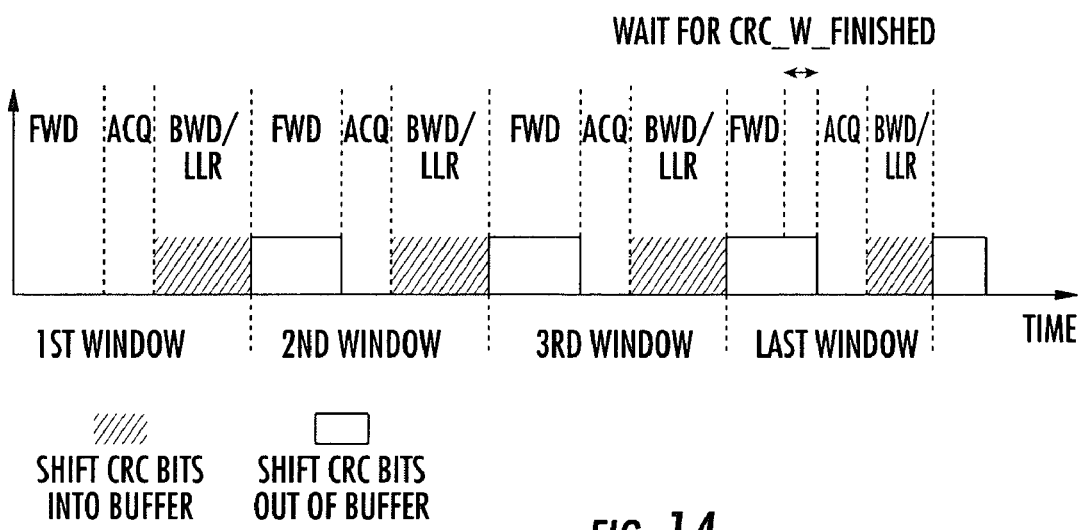
FIG. 14 shows a CRC processing scheme according to the invention.

These steps are performed in the CRC control state machine. Additionally some considerations have to be made. The LLRs are calculated window like in the reverse order, the maximum window size is the TC window size 64. Therefore the LLR bits have to be stored in a 64 bit buffer (dbuffer) during backward recursion/LLR calculation. These bits are shifted out into the CRC register during alpha recursion and beta acquisition. Each finished window is signaled with the crc_w_finished signal (FIG. 14). The memory control starts the beta recursion (a possible conflict can only occur during the last window, when the number of bits can be smaller than 64, and therefore the time for the alpha calculation is not long enough to shift all 64 bits from the buffer into the CRC register).

Additionally this unit calculates the LLR-sums for the iteration cancellation control of undecodable blocks. The stop criteria is based on the delta between successive MAP1 resp. MAP2 operations. If the delta is negative, this block is marked undecodable (delta failure signal). The buffering of the input CRC data and the shifting of the CRC register is only done during MAP1 operation and only when CRC length is not zero.

The CRC is checked in parallel to the MAP1 operation. Since it is not known in advance, if the block is correctly decoded, the decoder calculates the extrinsic information out of the LLRs (see eq. 2.2) and stores them in the LLR RAM to enable further decoding if the block is not error free. Thus after MAP1 the decoder can decide if the block was correctly decoded, but the LLRs are overwritten at that moment. Therefore an additional bit is introduced to store the hard decision (=MSB of the LLR) as well. This enables the decoder to stop after MAP1 because of successful CRC criteria and flush the hard decision of the LLR together with the extrinsic information.

4.12 Global Control Unit

Figure 15:
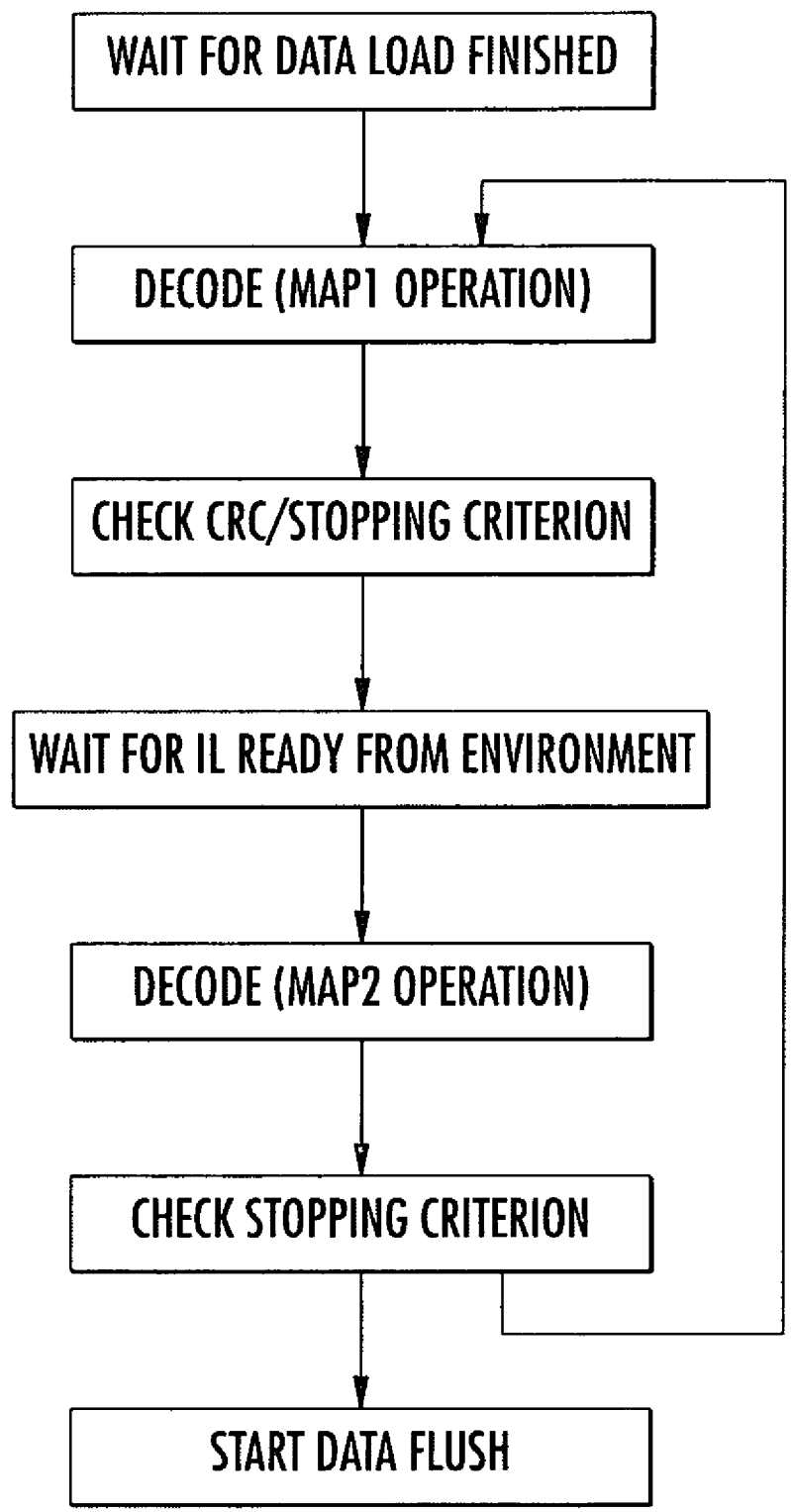
FIG. 15 shows global control steps for turbo-code decoding according to the invention.

At last, the combined decoder according to the invention comprises a global control unit which controls the decoding process on the MAP level. Since TC decoding is done in an iterative matter, the number of iterations depends on the actual decoding status. Therefore after each MAP operation a stop criteria is checked. This stopping criterion can either be the selected total number of half-iterations, a correctly detected CRC-sum (only after MAP1) or an early detection of undecodable blocks based on the mean value criteria. The particular decoding steps for TC are shown in FIG. 15. In case of CC decoding only one MAP1 operation is needed.

Furthermore the global control unit controls the handshake mode. This handshake mode allows step-by-step execution of the decoding steps and on-demand memory flush.

5. Advantages of the Invention

The combined decoder according to the invention offers in particular the following advantages:

Only one MAP unit shall be used, therefore the MAP1 and MAP2 operations are done serially on the same MAP unit.

A sliding window approach is used to decrease the size of the alpha state metric RAM, for TC a window size of 64 is chosen.

All 8 states of the TC are calculated in parallel, therefore at each time step during the recursions 8 new state metrics are calculated.

The forward, backward acquisition and backward recursion are all done serially on the same state metric unit.

During backward recursion the LLRs/extrinsic information are calculated in parallel, thus we do not need to store the beta state metrics, refer to equation 2.14 and 2.15.

Iterative TC decoding needs interleaving and deinterleaving of the extrinsic information. This would lead to two RAMs for the LLR (interleaved and deinterleaved) as well as two RAMs for the interleaver and deinterleaver pattern. For UMTS the content of the interleaver/deinterleaver table is specified as "read-address". Calculation of the branch metrics needs systematic, parity and extrinsic (a priori) information. So during MAP1 operation we read systematic and parity 1 information sequentially. The extrinsic information is read deinterleaved. The calculated new extrinsic information is stored sequentially in RAM2. MAP2 operation reads systematic and extrinsic interleaved, parity 2 sequential and stores the new calculated extrinsic information sequential again. This leads to two RAMs for the extrinsic (LLRs) and two RAMs for the interleaver/deinterleaver pattern.

However only the interleaver table is used. The LLRs are stored always in a sequential order in the LLR-RAM. We can write the LLRs on the previous read address of the a priori (and systematic) information and thus do an indirect deinterleaving. Therefore we need only one LLR-RAM and one RAM for the interleaver pattern. Since the extrinsic information is always stored sequentially in the original data sequence, MAP1 operation simply reads systematic, parity 1 and extrinsic information sequentially, new calculated extrinsic information is stored also sequentially. No access to the interleaver/deinterleaver RAM is required. During MAP2 operation the systematic and extrinsic information is read interleaved, and parity 2 is read sequentially. The new calculated extrinsic information can be written back to the read address, overwriting the no longer needed previous extrinsic information. This scheme only uses an interleaver table, so the deinterleaver RAM is obsolete. Nevertheless there would be a read/write conflict on the LLR RAM during backward recursion/LLR calculation, where new LLRs/ extrinsic information is produced. Therefore a LLR cache is used, which is filled during the forward recursion and read out during the backward recursion. Since the window size is 64 for TC, the size of this cache is only 64*6 bit.

The interleaver pattern generation is done outside the decoding means. For the decoding means the interleaver PAM is a simple external RAM. LogMAP or MaxLogMAP can be selected, and the min* function is used.

Possible variations of the invention will now be discussed. In the embodiment which has been described, the metrics memory means has been used for storing forward state metrics delivered during the turbo decoding and adaptable memory means has been used for storing forward state metrics delivered during the convolutional decoding. However these memories can be used to store the backward state metrics. This only depends on the direction of the windowing which is chosen. More precisely we can start the windowing from the end of the block by doing the backward recursion, storing the backward state metrics and then do forward/LLR together.

All kinds of soft-in-soft-out decoders might be used. In other words the invention covers all possible SISO implementations of the basic decoder and is not limited to the MAP algorithm and suboptimum versions (LogMAP and MaxLogMAP).

The combined decoder according to the invention may also be incorporated in a base station of a wireless communication system.

That which is claimed is:

1. A combined turbo-code/convolutional code decoder comprising:
   turbo-code decoding means for performing turbo-code decoding and convolutional code decoding means for performing convolutional coding, said turbo-code and convolutional code decoding means comprising common processing means forming a soft-in soft-out (SISO) unit having a first configuration dedicated to turbo-code decoding and a second configuration dedicated to convolutional code decoding;

metrics memory means for storing state metrics associated to states of a first trellis delivered by said common processing means in the first configuration;

input/output memory means for storing input and output data delivered to and by said common processing means in the second configuration;

adaptable memory means for storing input and output data delivered to and by said common processing means in the first configuration, and for storing state metrics associated to states of a second trellis delivered by said common processing means in the second configuration;

control means for configuring said common processing means in the first or second configuration depending on the code type; and memory control means for addressing said adaptable memory means depending on the configuration of said common processing means.

2. A combined decoder according to claim 1, wherein said turbo-code decoding means receives successive sequences of N1 symbols of b1 bits, and the input and output data delivered to and by said common processing means in the first configuration comprises for each received sequence g different blocks of N1 words of b1 bits; and wherein the states metrics to be stored in said adaptable memory means comprises a block of N2 words of b2 bits, with b2 being a multiple of b1;

wherein said adaptable memory means comprises g groups of p elementary memories respectively dedicated to the g blocks of N1 words, each elementary memory being adapted to store N2 words of b1 bits, and a product gp is equal to a ratio b2/b1 and a product pN2 is equal or greater than N1;

wherein said memory control means addresses said adaptable memory means in the first configuration such that each block of N1 words of b1 bits is written in or read from the dedicated group of p elementary memories;

wherein each state metric is formed with gp elementary words of b1 bits, and said memory control means addresses said adaptable memory means in the second configuration such that the gp elementary words of the state metric are respectively stored in the gp elementary memories at a same address.

3. A combined decoder according to claim 1, wherein said adaptable memory means comprises:

main memory means for storing the input and output data delivered to and by said common processing means in the first configuration, and for storing a first part of the states metrics delivered by said common processing means in the second configuration; and an additional memory means for storing a last part of the states metrics delivered by said common processing means in the second configuration.

4. A combined decoder according to claim 3, wherein said turbo-code decoding means receives successive sequences of N1 symbols of b1 bits, and the input and output data delivered to and by said common processing means in the first configuration comprises for each received sequence g different blocks of N1 words of b1 bits; and wherein the states metrics to be stored in said adaptable memory means is a block of N2 words of b2 bits, with b2 being greater than b1;

wherein said main memory means comprises g groups of p elementary memories respectively dedicated to the g blocks of N1 words, each elementary memory for storing N2 words of b1 bits, and a product gp is equal to an integer smaller than a ratio b2/b1 and a product pN2 is equal or greater than N1;

wherein said additional memory is for storing N2 words of b2-gp bits, and said memory control means addresses said adaptable memory means in the first configuration such that each block of N1 words of b1 bits is written in or read from the dedicated group of p elementary memories;

wherein each state metric is formed with gp elementary words of b1 bits plus an additional elementary word of b2-gp bits, said memory control means addresses said adaptable memory means in the second configuration such that the gp elementary words of the state metric are respectively stored in the gp elementary memories of said main memory means at the same address, whereas the additional elementary word of the state metric is stored in said additional memory means at the same address.

5. A combined decoder according to claim 1, wherein ST1 is the number of states of the first trellis, and ST2 the number of states of the second trellis, and r is an integer ratio ST2/ST1; and wherein said common processing means comprises a configurable state metrics unit for recursively calculating in parallel the ST1 state metrics in the first configuration, and for recursively calculating in serial r groups of in parallel calculated ST1 state metrics in the second configuration.

6. A combined decoder according to claim 5, wherein said common processing means comprises a branch metric unit for calculating in the first and second configurations the branch metrics associated to branches of the corresponding first and second trellis; and wherein said configurable state metrics unit comprises:

ST1 parallel add, compare and select units for calculating in the first and second configurations the ST1 state metrics;

auxiliary memory means for temporally storing the calculated states metrics for a recursive calculation; and auxiliary control means for controlling the storage of the metrics in said auxiliary memory means depending on the configuration of said common processing means.

7. A combined decoder according to claim 6, wherein said auxiliary memory means comprises a register for temporally storing the ST1 state metrics during the turbo-code decoding, and two pairs of supplementary memories connected to said register for temporally storing the ST2 state metrics during the convolutional code decoding; and wherein said auxiliary control means comprises first multiplexing means connected between an output of said register and said two pairs of supplementary memories for allowing a storage swapping of the metrics in said supplementary memories, and second multiplexing means connected directly to the output of said register and to outputs of said supplementary memories.

8. A combined decoder according to claim 5, wherein said state metrics unit recursively calculates backward state metrics similar to calculating forward state metrics.

9. A combined decoder according to claim 5, wherein said common processing unit comprises a log-likelihood-ratio (LLR) unit connected to said state metrics unit and to said metrics memory means in the first configuration, and to said adaptable memory means in the second configuration for calculating in each configuration soft output information containing values of the decoded data respectively associated with a confidence value.

10. A combined decoder according to claim 9, wherein said LLR unit has a pipelined architecture, and comprises a portion used for both turbo-code decoding and convolutional code decoding.

11. A combined decoder according to claim 1, wherein said common processing means implements a maximum-a-posteriori (MAP) algorithm.

12. A combined decoder according to claim 11, wherein the MAP algorithm comprises a LogMAP algorithm or a MaxLogMAP algorithm.

13. A combined decoder according to claim 1, wherein said turbo-code decoding means comprises global control means for allowing the turbo-code decoding to be performed in an iterative matter on said common processing means.

14. A combined decoder according to claim 1, being formed as an integrated circuit.

15. A terminal of a wireless communication system comprising:
a combined turbo-code/convolutional code decoder comprising
a turbo-code decoder for performing turbo-code decoding and a convolutional code decoder for performing convolutional coding, said turbo-code and convolutional code decoders comprising a common processor forming a soft-in soft-out (SISO) unit having a first configuration dedicated to turbo-code decoding and a second configuration dedicated to convolutional code decoding,
a metrics memory for storing state metrics associated to states of a first trellis delivered by said common processor in the first configuration,
an input/output memory for storing input and output data delivered to and by said common processor in the second configuration,
an adaptable memory for storing input and output data delivered to and by said common processor in the first configuration, and for storing state metrics associated to states of a second trellis delivered by said common processor in the second configuration,
a controller for configuring said common processor in the first or second configuration depending on the code type, and
a memory controller for addressing said adaptable memory depending on the configuration of said common processor.

16. A terminal according to claim 15, wherein the terminal forms a cellular phone.

17. A terminal according to claim 15, wherein the terminal forms a base station.

18. A terminal according to claim 15, wherein said turbo-code decoder receives successive sequences of N1 symbols of b1 bits, and the input and output data delivered to and by said common processor in the first configuration comprises for each received sequence g different blocks of N1 words of b1 bits; and
wherein the states metrics to be stored in said adaptable memory comprises a block of N2 words of b2 bits, with b2 being a multiple of b1;
wherein said adaptable memory comprises g groups of p elementary memories respectively dedicated to the g blocks of N1 words, each elementary memory being adapted to store N2 words of b1 bits, and a product gp is equal to a ratio b2/b1 and a product pN2 is equal or greater than N1;
wherein said memory controller addresses said adaptable memory in the first configuration such that each block of N1 words of b1 bits is written in or read from the dedicated group of p elementary memories;
wherein each state metric is formed with gp elementary words of b1 bits, and said memory controller addresses said adaptable memory in the second configuration such that the gp elementary words of the state metric are respectively stored in the gp elementary memories at a same address.

19. A terminal according to claim 15, wherein said adaptable memory comprises:
a main memory for storing the input and output data delivered to and by said common processor in the first configuration, and for storing a first part of the states metrics delivered by said common processor in the second configuration; and
an additional memory for storing a last part of the states metrics delivered by said common processor in the second configuration.

20. A terminal according to claim 19, wherein said turbo-code decoder receives successive sequences of N1 symbols of b1 bits, and the input and output data delivered to and by said common processor in the first configuration comprises for each received sequence g different blocks of N1 words of b1 bits; and
wherein the states metrics to be stored in said adaptable memory is a block of N2 words of b2 bits, with b2 being greater than b1;
wherein said main memory comprises g groups of p elementary memories respectively dedicated to the g blocks of N1 words, each elementary memory for storing N2 words of b1 bits, and a product gp is equal to an integer smaller than a ratio b2/b1 and a product pN2 is equal or greater than N1;
wherein said additional memory is for storing N2 words of b2-gp bits, and said memory controller addresses said adaptable memory in the first configuration such that each block of N1 words of b1 bits is written in or read from the dedicated group of p elementary memories;
wherein each state metric is formed with gp elementary words of b1 bits plus an additional elementary word of b2-gp bits, said memory controller addresses said adaptable memory in the second configuration such that the gp elementary words of the state metric are respectively stored in the gp elementary memories of said main memory at the same address, whereas the additional elementary word of the state metric is stored in said additional memory at the same address.

21. A terminal according to claim 15, wherein ST1 is the number of states of the first trellis, and ST2 the number of states of the second trellis, and r is an integer ratio ST2/ST1; and wherein said common processor comprises a configurable state metrics unit for recursively calculating in parallel the ST1 state metrics in the first configuration, and for recursively calculating in serial r groups of in parallel calculated ST1 state metrics in the second configuration.

22. A terminal according to claim 21, wherein said common processor comprises a branch metric unit for calculating in the first and second configurations the branch metrics associated to branches of the corresponding first and second trellis; and wherein said configurable state metrics unit comprises:
ST1 parallel add, compare and select units for calculating in the first and second configurations the ST1 state metrics;
an auxiliary memory for temporally storing the calculated states metrics for a recursive calculation; and
an auxiliary controller for controlling the storage of the metrics in said auxiliary memory depending on the configuration of said common processor.

23. A terminal according to claim 22, wherein said auxiliary memory comprises a register for temporally storing the ST1 state metrics during the turbo-code decoding, and two pairs of supplementary memories connected to said register for temporally storing the ST2 state metrics during the convolutional code decoding; and wherein said auxiliary controller comprises a first multiplexer connected between an output of said register and said two pairs of supplementary memories for allowing a storage swapping of the metrics in said supplementary memories, and a second multiplexer connected directly to the output of said register and to outputs of said supplementary memories.

24. A terminal according to claim 21, wherein said common processing unit comprises a log-likelihood-ratio (LLR) unit connected to said state metrics unit and to said metrics memory in the first configuration, and to said adaptable memory in the second configuration for calculating in each configuration soft output information containing values of the decoded data respectively associated with a confidence value.

25. A method for operating a combined turbo-code/convolutional code decoder comprising:
    providing a turbo-code decoder for performing turbo-code decoding and a convolutional code decoder for performing convolutional coding, the turbo-code and convolutional code decoders comprising a common processor forming a soft-in soft-out (SISO) unit having a first configuration dedicated to turbo-code decoding and a second configuration dedicated to convolutional code decoding;
    storing in a metrics memory state metrics associated to states of a first trellis delivered by the common processor in the first configuration;
    storing in an input/output memory input and output data delivered to and by the common processor in the second configuration;
    storing in an adaptable memory input and output data delivered to and by the common processor in the first configuration, and for storing state metrics associated to states of a second trellis delivered by the common processor in the second configuration;
    configuring the common processor in the first or second configuration depending on the code type; and
    addressing the adaptable memory depending on the configuration of the common processor.

26. A method according to claim 25, wherein the turbo-code decoder receives successive sequences of N1 symbols of b1 bits, and the input and output data delivered to and by the common processor in the first configuration comprises for each received sequence g different blocks of N1 words of b1 bits; and
    wherein the states metrics to be stored in the adaptable memory comprises a block of N2 words of b2 bits, with b2 being a multiple of b1;
    wherein the adaptable memory comprises g groups of p elementary memories respectively dedicated to the g blocks of N1 words, each elementary memory being adapted to store N2 words of b1 bits, and a product gp is equal to a ratio b2/b1 and a product pN2 is equal or greater than N1;
    wherein addressing the adaptable memory comprises addressing the adaptable memory in the first configuration such that each block of N1 words of b1 bits is written in or read from the dedicated group of p elementary memories; and wherein each state metric is formed with gp elementary words of b1 bits, and addressing the adaptable memory comprises addressing the adaptable memory in the second configuration such that the gp elementary words of the state metric are address.

27. A method according to claim 25, wherein the adaptable memory comprises a main memory for storing the input and output data delivered to and by the common processor in the first configuration, and for storing a first part of the states metrics delivered by the common processor in the second configuration; and an additional memory for storing a last part of the states metrics delivered by the common processor in the second configuration.

28. A method according to claim 27, wherein the turbo-code decoder receives successive sequences of N1 symbols of b1 bits, and the input and output data delivered to and by the common processor in the first configuration comprises for each received sequence g different blocks of N1 words of b1 bits; and
    wherein the states metrics to be stored in the adaptable memory is a block of N2 words of b2 bits, with b2 being greater than b1;
    wherein the main memory comprises g groups of p elementary memories respectively dedicated to the g blocks of N1 words, each elementary memory for storing N2 words of b1 bits, and a product gp is equal to an integer smaller than a ratio b2/b1 and a product pN2 is equal or greater than N1;
    wherein the additional memory is for storing N2 words of b2-gp bits, and the memory controller addresses the adaptable memory in the first configuration such that each block of N1 words of b1 bits is written in or read from the dedicated group of p elementary memories;
    wherein each state metric is formed with gp elementary words of b1 bits plus an additional elementary word of b2-gp bits, the memory controller addresses the adaptable memory in the second configuration such that the gp elementary words of the state metric are respectively stored in the gp elementary memories of the main memory at the same address, whereas the additional elementary word of the state metric is stored in the additional memory at the same address.

29. A method according to claim 25, wherein ST1 is the number of states of the first trellis, and ST2 the number of states of the second trellis, and r is an integer ratio ST2/ST1; and wherein the common processor comprises a configurable state metrics unit for recursively calculating in parallel the ST1 state metrics in the first configuration, and for recursively calculating in serial r groups of in parallel calculated ST1 state metrics in the second configuration.

30. A method according to claim 29, wherein the common processor comprises a branch metric unit for calculating in the first and second configurations the branch metrics associated to branches of the corresponding first and second trellis; and wherein the configurable state metrics unit comprises:
    ST1 parallel add, compare and select units for calculating in the first and second configurations the ST1 state metrics;
    an auxiliary memory for temporally storing the calculated states metrics for a recursive calculation; and
    an auxiliary controller for controlling the storage of the metrics in the auxiliary memory depending on the configuration of the common processor.

31. A method according to claim 30, wherein the auxiliary memory comprises a register for temporally storing the ST1 state metrics during the turbo-code decoding, and two pairs of supplementary memories connected to the register for temporally storing the ST2 state metrics during the convolutional code decoding; and wherein the auxiliary controller comprises a first multiplexer connected between an output of the register and the two pairs of supplementary memories for allowing a storage swapping of the metrics in the supplementary memories, and a second multiplexer connected directly to the output of the register and to outputs of the supplementary memories.

32. A method according to claim 29, wherein the common processing unit comprises a log-likelihood-ratio (LLR) unit connected to the state metrics unit and to the metrics memory in the first configuration, and to the adaptable memory in the second configuration for calculating in each configuration soft output information containing values of the decoded data respectively associated with a confidence value.

33. A method according to claim 25, wherein the common processor implements a maximum-a-posteriori (MAP) algorithm.

* * * * *

UNITED STATES PATENT AND TRADEMARK OFFICE
CERTIFICATE OF CORRECTION

PATENT NO. : 7,191,377 B2
APPLICATION NO. : 10/653721
DATED : March 13, 2007
INVENTOR(S) : Berens et al.

It is certified that error appears in the above-identified patent and that said Letters Patent is hereby corrected as shown below:

| | |
|---|---|
| Column 2, Line 65 | Delete: " code " (first occurrence)<br>Insert: -- code decoding -- |
| Column 3, Line 28 | Delete: "comprises"<br>Insert: -- comprise -- |
| Column 7, Line 13 | Delete: "UNTS"<br>Insert: -- UMTS -- |
| Column 8, Line 51 | Delete: "iterations, "<br>Insert: -- iterations. -- |
| Column 8, Line 54 | Insert -- . -- after "parity 2)" |
| Column 12, Line 29 | Delete: "sequential "<br>Insert: -- sequentially -- |
| Column 12, Lines 51-52 | Delete: "demodulator"<br>Insert: -- demodulator RR -- |
| Column 13, Line 30 | Delete: " PAM "<br>Insert: -- RAM -- |
| Column 13, Line 45 | Delete: "configurate"<br>Insert: -- configure -- |
| Column 13, Line 46 | Delete: "CCER"<br>Insert: -- CCPR -- |
| Column 14, Line 29 | Delete: "or "<br>Insert: -- for -- |
| Column 17, Line 10 | Delete: " (AXMM) for "<br>Insert: -- (AXMM is for -- |
| Column 17, Line 62 | Delete: "output"<br>Insert: -- outputs -- |
| Column 17, Line 63 | Delete: " Bestate "<br>Insert: -- B state -- |

UNITED STATES PATENT AND TRADEMARK OFFICE
CERTIFICATE OF CORRECTION

PATENT NO. : 7,191,377 B2
APPLICATION NO. : 10/653721
DATED : March 13, 2007
INVENTOR(S) : Berens et al.

It is certified that error appears in the above-identified patent and that said Letters Patent is hereby corrected as shown below:

| | |
|---|---|
| Column 18, Line 32 | Delete: "multiplexer"<br>Insert: -- multiplexers -- |
| Column 20, Line 28 | Delete: "total"<br>Insert: -- a total of -- |
| Column 21, Line 52 | Delete: " sequential "<br>Insert: -- sequentially -- |
| Column 26, Line 4 | Delete: " sequential "<br>Insert: -- sequentially -- |
| Column 26, Line 5 | Delete: " sequential "<br>Insert: -- sequentially -- |
| Column 26, Line 33 | Delete: " PAM "<br>Insert: -- RAM -- |
| Column 32, Lines 2-3 | Delete: " are address. "<br>Insert: -- are respectively stored in the gp elementary memories at a same address.-- |

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,191,377 B2  Page 1 of 1
APPLICATION NO. : 10/653721
DATED : March 13, 2007
INVENTOR(S) : Berens et al.

It is certified that error appears in the above-identified patent and that said Letters Patent is hereby corrected as shown below:

Column 26, Line 62    Delete: "coding"
    Insert: -- decoding --

Column 29, Line 19    Delete: "coding"
    Insert: -- decoding --

Column 31, Line 23    Delete: "coding"
    Insert: -- decoding --

Signed and Sealed this

Second Day of June, 2009

JOHN DOLL
*Acting Director of the United States Patent and Trademark Office*